United States Patent
Gerlach et al.

(10) Patent No.: US 6,946,654 B2
(45) Date of Patent: Sep. 20, 2005

(54) COLLECTION OF SECONDARY ELECTRONS THROUGH THE OBJECTIVE LENS OF A SCANNING ELECTRON MICROSCOPE

(75) Inventors: Robert L. Gerlach, Portland, OR (US); Karel D. van der Mast, Portland, OR (US); Michael R. Scheinfein, Portland, OR (US)

(73) Assignee: FEI Company, Hillboro, OR (US)

( * ) Notice: Subject to any disclaimer, the term of this patent is extended or adjusted under 35 U.S.C. 154(b) by 479 days.

(21) Appl. No.: 09/840,558

(22) Filed: Apr. 23, 2001

(65) Prior Publication Data

US 2002/0024013 A1 Feb. 28, 2002

Related U.S. Application Data

(60) Provisional application No. 60/199,280, filed on Apr. 24, 2000.

(51) Int. Cl.[7] ............................ G01N 23/00; G21K 7/00
(52) U.S. Cl. ...................... 250/310; 250/306; 250/311; 250/396 ML
(58) Field of Search ................................. 250/306, 310, 250/311, 396 ML, 307, 305

(56) References Cited

U.S. PATENT DOCUMENTS

| | | | | |
|---|---|---|---|---|
| 4,126,781 A | | 11/1978 | Siegel | 250/281 |
| 4,740,694 A | * | 4/1988 | Nishimura et al. | 250/306 |
| 4,806,754 A | * | 2/1989 | Gerlach | 250/281 |
| 4,810,879 A | | 3/1989 | Walker | 250/305 |
| 4,810,880 A | | 3/1989 | Gerlach | 250/305 |
| 4,818,872 A | | 4/1989 | Parker et al. | 250/309 |
| 5,770,863 A | * | 6/1998 | Nakasuji | 250/310 |
| 5,834,770 A | | 11/1998 | Holkeboer et al. | 250/281 |
| 5,847,399 A | * | 12/1998 | Schmitt et al. | 250/396 ML |
| 5,872,358 A | * | 2/1999 | Todokoro et al. | 250/310 |
| 6,043,491 A | * | 3/2000 | Ose et al. | 250/305 |
| 6,114,695 A | * | 9/2000 | Todokoro et al. | 250/310 |
| 6,218,664 B1 | | 4/2001 | Krans et al. | 250/310 |
| 6,310,341 B1 | * | 10/2001 | Todokoro et al. | 250/310 |
| 6,414,323 B1 | * | 7/2002 | Abe et al. | 250/443.1 |
| 6,455,848 B1 | * | 9/2002 | Krijn et al. | 250/310 |
| 6,570,163 B1 | * | 5/2003 | El Gomati et al. | 250/397 |

OTHER PUBLICATIONS

Bauer, E., Koziol, C., Lilienkamp, G., Schmidt, T.; "Spectromicroscopy in a Low Energy Electron Microscope", *Journal of Electron Spectroscopy and Related Phenomena*, vol. 84, pp. 201–209(1997).

Krans, J.M. and van Rooy, T.L., "A Miniature Low Voltage SEM with High Resolution", *Microscopy and Microanalysis*, vol. 5, Supplement 2, pp 2–4, Portland, OR, Aug. 1–5, 1999.

(Continued)

*Primary Examiner*—John R. Lee
*Assistant Examiner*—Paul M. Gurzo
(74) *Attorney, Agent, or Firm*—Michael D. Scheinberg

(57) ABSTRACT

A high resolution scanning electron microscope collects secondary Auger electrons through its objective lens to sensitively determine the chemical make-up with extremely fine positional resolution. The system uses a magnetic high resolution objective lens, such as a snorkel lens or a dual pole magnetic lens which provides an outstanding primary electron beam performance. The Auger electrons are deflected from the path of the primary beam by a transfer spherical capacitor. The primary beam is shielded, by a tube or plates, as it traverses the spherical capacitor to prevent aberration of the primary beam and the external wall of the shield maintains a potential gradient related to that of the spherical capacitor to reduce aberration of the primary electron beam. The coaxial configuration of the primary electron beam and the collected secondary electron beam allows the Auger image to coincide with the SEM view.

31 Claims, 13 Drawing Sheets

OTHER PUBLICATIONS

Kruit, P. "Auger Electron Spectroscopy in the STEM," *Quantitative Microbeam Analysis, Proc. Of the 40$^{th}$ Scottish Universities Summer School in Phusics*, Aug. 1993.

Kruit, P., "Magnetic Through–the–lens Detection in Electron Microscopy and Spectroscopy, Part 1" *Advances in Optical and Electron Microscopy*, vol. 12 ed., Mulvey and Sheppard, Academic Press, pp. 93–137 (1991).

Postek, Michael T., "The Scanning Electron Microscope," *Handbook of Charged Particle Optics*, edited by Jon Orloff, CRC Press LLC, 1997; Ch. 9, pp. 363–382.

Purcell, E.M., "The Focusing of Charged Particles by a Spherical Condenser," *Phys. Rev.*, 54, pp. 818–826 (1938).

Sar–El, H.Z., "Criterion for Comparing Analyzers," *The Review of Scientific Instruments*, vol. 41, No. 4, 561–564 (1970).

* cited by examiner

COLLECTION OF SECONDARY ELECTRONS THROUGH THE OBJECTIVE LENS OF A SCANNING ELECTRON MICROSCOPE

This application claims priority from U.S. Prov. App. No. 60/199,280, filed Apr. 24, 2000.

TECHNICAL FIELD OF THE INVENTION

The present invention relates to determining the properties of microscopic structures and, in particular, to a scanning electron microscope that collects through its objective lens secondary electrons for analysis, such as Auger electron spectroscopy.

BACKGROUND OF THE INVENTION

Electronic devices are constantly being made smaller to decrease their production costs and increase their operating speeds. To develop suitable new manufacturing processes and to correct defects in existing processes, engineers and scientists need analytical instruments that can create images of extremely small features and determine the chemical make-up of those features. Scanning electrons microscopes (SEMs) are widely used for imaging microscopic features, and Auger Electron Spectroscopy (AES) is often used to determine the chemical make-up of feature surfaces. AES can detect the presence of the lighter elements in quantities as small as a few atomic layers or less. In Scanning Auger Microscopy (SAM), analyses can be made in three modes: spectral analysis, single element maps, and depth profiles using simultaneous ion milling and Auger analysis.

In an SEM, a finely focused primary electron beam is scanned over a specimen. The impact of the primary electron beam causes the ejection of electrons, referred to as secondary electrons. An image of the target is then formed in which the brightness of each point on the image is determined by the number of secondary electrons ejected while the primary electron beam was impinging at that point. The finely focused electron beam of an SEM allows for the production of an image of greater magnification, greater depth of focus, and higher resolution than can be achieved by the best optical microscopes.

Secondary electrons are ejected from the specimen by a variety of mechanisms. One of those mechanisms, the Auger process, produces electrons having energies characteristic of the material from which the electronics are ejected. Electrons produced by the Auger process are known as Auger electrons. AES is the process of analyzing the energy of the Auger electrons and determining the type of material from which the electrons were emitted.

Unfortunately, only a small number of the impacting electrons give rise to Auger electrons. Typically, somewhere between one thousand and one hundred thousand primary electrons are required to produce one Auger electron. To detect a material present in the sample at very low concentrations, it is necessary therefore to efficiently collect and analyze the Auger electrons. Auger electrons are emitted nearly isotropically, that is, approximately equally in all directions above the target, so it is necessary to collect Auger electrons from as much of the hemisphere above the sample as possible.

FIG. 1 shows schematically a conventional SEM 1 with an AES system 2. An electron column 3 directs a primary electron beam 4 toward a sample 5. Secondary electrons 6 are collected through an opening 7 to the side of the primary beam and transferred to an analyzer 8. Because the objective lens of electron column 3 takes up much of the space near the sample, it is difficult to position opening 7 sufficiently near the sample to collect more than a small portion of the Auger electrons. Since opening 7 collects electrons from only a small portion of the hemisphere above the sample, it is not an efficient collector, and side-mounted AES systems on SEMs are not very sensitive, that is, they are not able to detect extremely small concentrations of a material. Moreover, such side-mounted electron collectors are incompatible with high resolution electron lenses for SEMs, because the magnetic field from the lenses greatly reduces the number of electrons collected.

Many attempts have been made to increase the sensitivity of AES systems by increasing the percentage of collected Auger electrons. For example, U.S. Pat. No. 4,810,880 issued to one of the present applicants discloses a Direct Imaging Auger System that uses a wide electron beam from a side-mounted source to illuminate a large area on a sample. The electrons emitted from the sample are then collected using a high resolution "snorkel" electron lens pole piece positioned immediately below the specimen. A secondary electron optical system forms an image of the sample using the secondary electrons, and the electrons from different parts of the sample can be separated and analyzed to determine the types of materials present at different locations on the sample. This type of instrument, in which the primary beam impacts and forms an image of a large area of the sample, is referred to as an "imaging" instrument, as opposed to a "scanning" instrument, which illuminates only a small point of the sample at one time, collects electrons from that one point, and then combines the information for all scanned points to create an image. In an imaging instrument, the resolution depends primarily how faithfully the collection system can reproduce an image of the specimen, whereas in a scanning system, the resolution depends primarily on the size of the illuminating beam. An imaging instrument typically cannot collect Auger electrons from each point as efficiently as a scanning instrument and so the primary beam current density is increased to produce additional Auger electrons. The higher beam current can cause more sample damage than a scanning instrument would cause at comparable beam energies.

In another approach, a Low Energy Electron Microscope (LEEM) System is described in "Spectroscopy in a Low Energy Electron Microscope" by E. Bauer, C. Koziol, G. Lilienkamp, and T. Schmidt, *Journal of Electron Spectroscopy and Related Phenomena*, Vol. 84, pp. 201–209 (1997). The Bauer et al. instrument provides Auger spectra and images of surfaces. This is also an imaging type instrument as opposed to a scanning instrument and is very complex. The demonstrated Auger image resolution for silver is about 100 nm, which is relatively low for use in semiconductor industry applications.

A Transmission Electron Microscope (TEM) is an imaging instrument that uses a high energy electron beam and forms an image of the sample using electrons that are transmitted through the sample and collected on the opposite side. A Scanning Transmission Electron Microscope (STEM) also uses electrons transmitted through the sample, but scans a high energy beam across the sample, rather than illuminating the entire sample area simultaneously. Such instruments have high resolution but, because electrons must go completely through the sample, can be used only with very thin samples. It is known to collect secondary electrons back through the lens of the primary electron column of a TEM. Such a system is described by Kruit in "Auger Electron Spectroscopy in the STEM," *Quantitative Micro-* beam Analysis, Proc. of the 40$^{th}$ Scottish Universities Summer School in Physics, August,1993 ISBN 0-7503-025 6–9, p. 121–143. Such systems employ an objective lens that produces a strong magnetic field which "parallelizes" the secondary electrons, that is, the magnetic field changes the trajectories of the secondary electrons from a widely dispersive pattern to an almost parallel pattern, as they are transmitted up through the lens pole piece. Beyond the lens, a magnetic deflector or a combination magnetic and electrostatic deflector, such as a Wien filter, deflects the secondary electrons to the side of the primary beam towards an Auger electron energy analyzer.

The secondary Auger electrons can be readily separated from the primary beam electrons because of the large difference in the energy between the Auger electrons and the primary beam electrons. Electrons in the primary beam of a TEM have an energy of about 200 keV and the Auger electrons have energies about 50 eV to 3000 eV energy. With this large difference between primary beam electron energy and Auger electron energies, a magnetic field can separate the Auger electrons with minimal aberration of the primary electron beam.

The desirability of implementing a similar through-the-lens Auger electron system in an SEM has been recognized, and attempts to create such a system are described, for example, by P. Kruit in "Magnetic Through-the-Lens Detection in Electron Microscopy and Spectroscopy, Part 1," in *Advances in Optical and Electron Microscopy*, Vol. 12 ed., Mulvey and Sheppard, Academic Press, pp.93–137 (1991). Such attempts have met with limited success.

A primary problem in incorporating through-the-lens collection of secondary electrons in an SEM is the difficulty of separating the secondary electrons returning through the lens along the same path as the primary beam electrons. The electrons in the primary beam of an SEM typically have energies of between 3 keV to 30 keV, which is significantly less than the typical 200 keV energy of electrons in a TEM primary beam and is much closer to the 50 eV to 3,000 eV energy of the Auger electrons. The separating or deflecting device used in the TEM Auger systems to separate the electrons transmitted back through the lens, while producing minimal aberrations in the high energy TEM beam, can cause severe aberrations in the lower energy SEM primary beam, thereby reducing the resolution and usefulness of the SEM. Although the aberrations can be reduced by known methods, such as designing a primary beam crossover in the magnetic deflector or Wien filter device, such solutions restrict the optical flexibility of the primary beam optics, since such solutions tend to increase primary beam aberrations from another source, that is, beam interactions. Moreover, such magnetic deflector devices have hysteresis, which can adversely affect performance.

Consequently, there is a need for a method and apparatus that combines SEM imaging and Auger electron spectroscopy and that provides maximum performance of both the SEM and AES functions.

SUMMARY OF THE INVENTION

Thus, it is an object of the invention to provide a system for through-the-lens collection of secondary electrons in a high resolution scanning electron microscope.

The present invention comprises a scanning electron microscope system that includes through-the-lens collection of secondary electrons, and is particularly suited for collecting Auger electrons. Because the electron collection system does not physically or electrically interfere with the primary beam optics, a high current, high resolution primary beam objective lens can be used, thereby significantly increasing the secondary electron signal and reducing signal acquisition time compared to prior art systems without significantly compromising the performance of the high resolution lens.

Additional objects, advantages and novel features of the invention will become apparent from the detailed description and drawings of the invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIG. 8A shows the geometric aberration in an Auger image at the output of the transfer spherical capacitor in FIG. 3;

FIG. 8B shows the geometric aberration of FIG. 8A with an energy offset added;

FIG. 8C shows the geometric aberration of FIG. 8B with chromatic aberration added;

DETAILED DESCRIPTION OF PREFERRED EMBODIMENTS

General features of preferred embodiments of scanning electron microscope systems having through-the-lens secondary electron detector systems according to the present invention are illustrated in the following description and figures.

The inventive system preferably uses a high resolution objective lens, such as an extended field (snorkel) lens, an immersion lens, or a dual pole magnetic lens. Secondary electrons are collected through the objective lens and then deflected away from the primary beam axis to a detector, preferably an Auger electron spectrometer. In a preferred embodiment, an electrostatic lens inside of the primary beam objective lens accelerates the Auger electrons away from the sample and reduces the angle of secondary electrons exiting the objective lens. A deflector, such as a spherical capacitor, deflects the Auger electrons out of the primary beam path. The primary beam is shielded as it passes through the deflector to prevent aberration of the primary beam. The shield is preferably conductive on the inside to shield the primary beam and supports on the outside a potential gradient that reduces aberration of the Auger electrons in the deflector.

In a preferred embodiment, the objective lens and electrostatic deflectors parallelize the Auger electrons emitted isotropically from the sample to form a virtual Auger source near the face of the primary beam objective lens. The Auger electron optical system forms an image of a virtual Auger source off the primary beam path. The image is directed through a transfer lens into a spherical capacitor analyzer to determine with great sensitivity the materials present at a precise location on the sample surface. Imaging the Auger electrons off of the primary beam path obviates the need to confine the Auger electrons all the way through the vacuum chamber to a connected exterior analyzer. The electron optical system of the present invention also provides excellent transmission of the electrons, so that the signal is still at least as great at the analyzer as that of prior art systems using the same primary beam current.

Physical Description of a Preferred Embodiment

Figure 1:
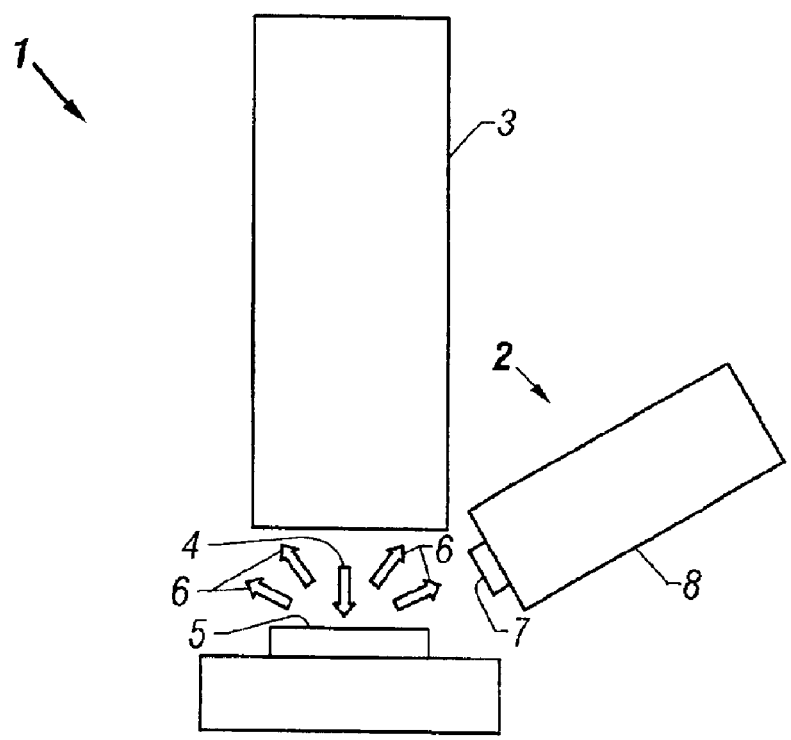
FIG. 1 is a schematic diagram of a prior art scanning electron microscope having a side mounted Auger electron spectrometer.
Figure 2:
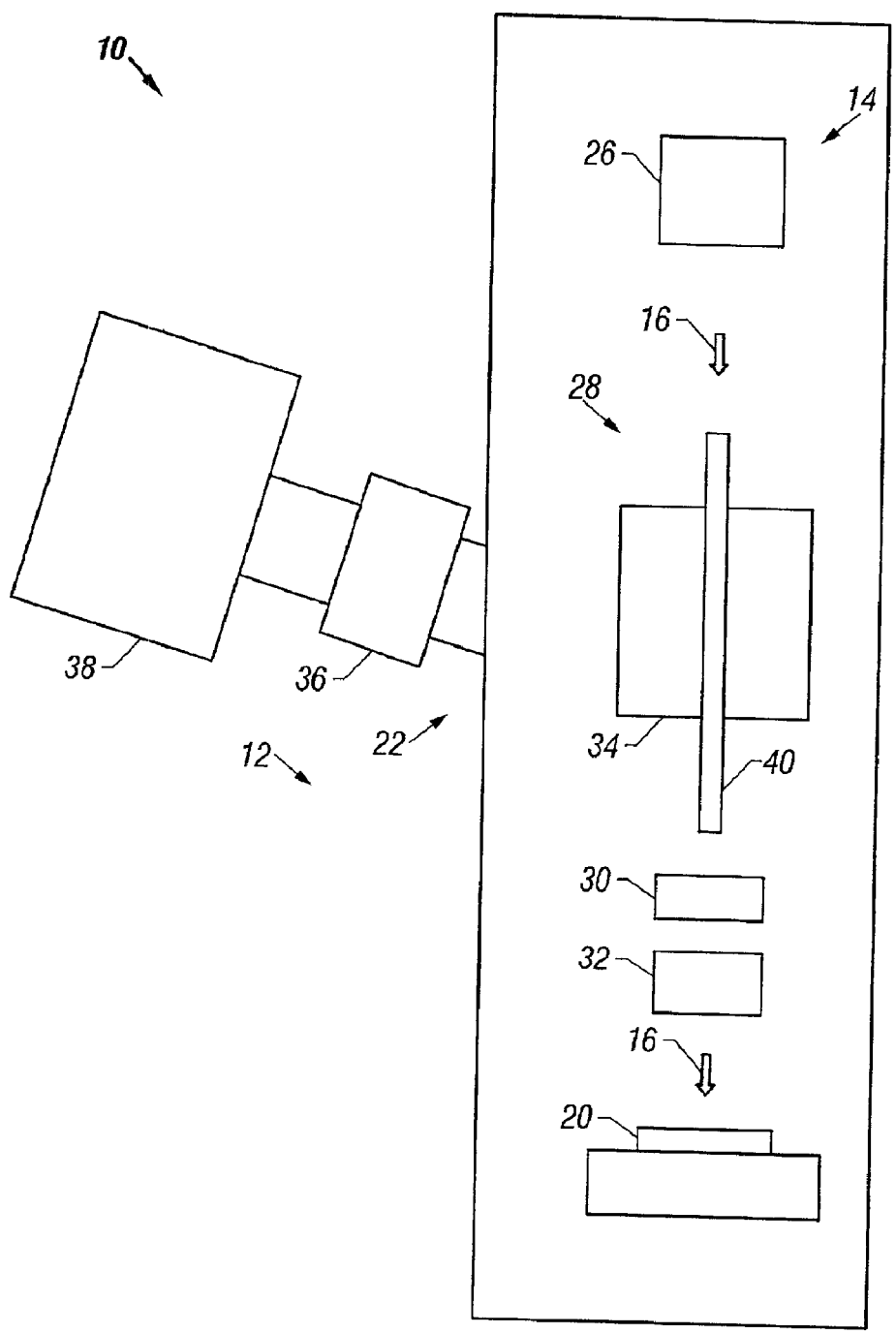
FIG. 2 is a schematic diagram of a scanning electron microscope of the present invention using through-the-lens collection of secondary electrons.

FIG. 2 shows schematically a preferred embodiment of a scanning electron microscope system 10 of the present invention having a through-the-lens secondary electron collection system 12. Electron microscope system 10 includes a primary beam optical system 14 for forming a primary beam 16 and focusing it onto a sample 20 to cause the emission of secondary electrons, including Auger electrons, and a secondary electron optical system 22 for collecting the secondary electrons and transmitting them to a detector or analyzer 38. Primary beam optical system 14 includes an electron beam source 26 and a primary beam electron column 28 including a primary beam deflection system 30 for causing primary beam 16 to scan the surface of sample 20 and an objective lens 32 for final focusing of primary beam 16.

Secondary electron optical system 22 includes a secondary electron deflector 34, a transfer lens 36, and a secondary electron detector or analyzer 38. Secondary electron optical system 22 also includes objective lens 32 and primary beam deflector 30 because these components affect the secondary electrons as well as the primary beam. A shield 40 protects primary beam 16 from being deflected and from electric field aberrations as it traverses secondary electron deflector 34.

Figure 3:
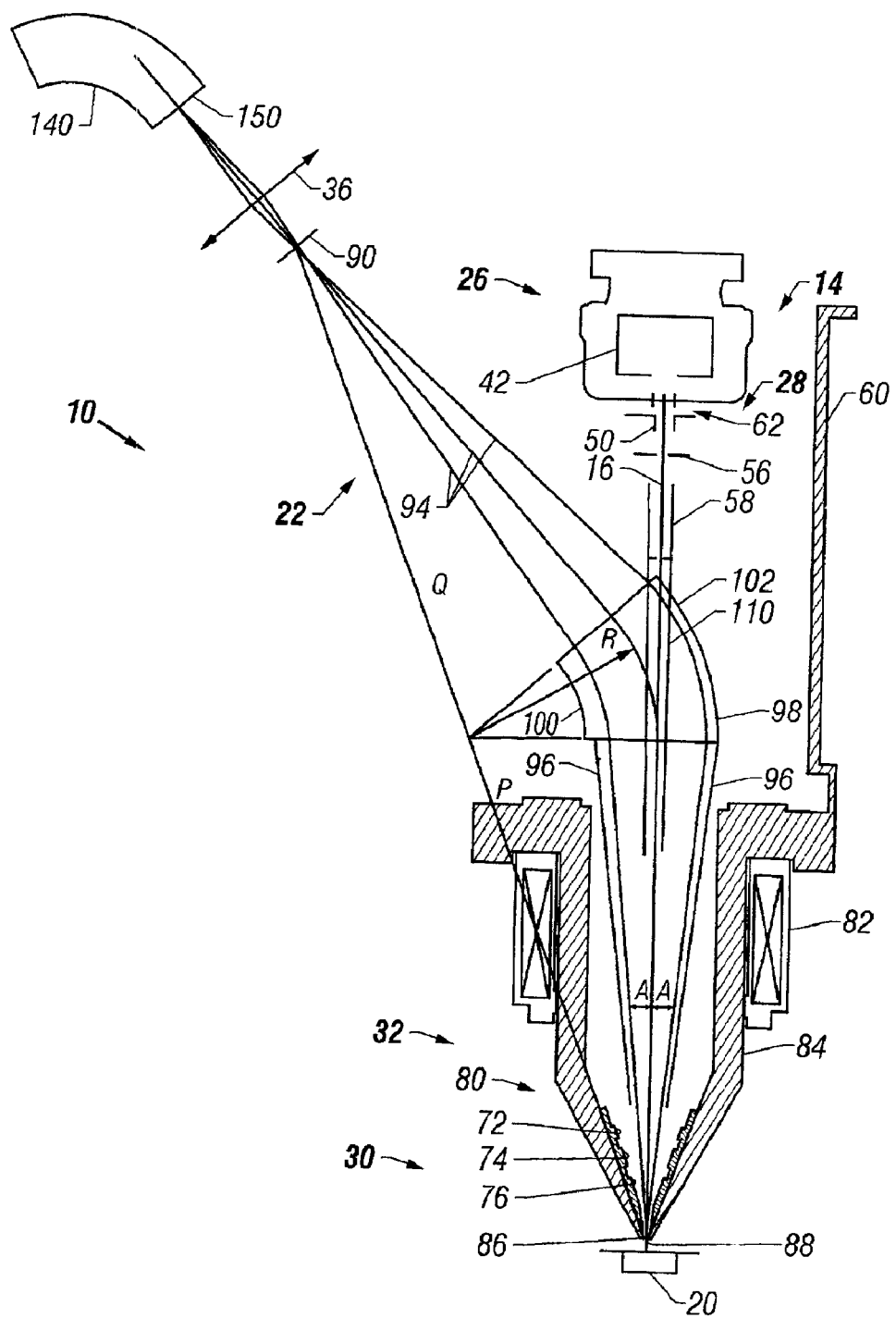
FIG. 3 is a partial cross-sectional view showing a preferred embodiment of a scanning electron microscope apparatus having through-the-lens Auger detector in accordance with the present invention.

FIG. 3 shows in more detail a preferred embodiment of the invention. Electron beam source 26 comprises an electron gun 42 that includes an electron emission source (not shown), such as a Schottky field emission source, and electron optical components (not shown) that form the electrons into a beam and accelerate them to a desired energy. Such electron guns 42 are commercially available, for example, from FEI Company, Hillsboro, Oreg., the assignee of the present invention.

An anode 50 positioned after electron gun 42 further accelerates the primary electrons. Anode 50 is preferably maintained at an electrical potential of approximately +2 kV. Primary beam optical system 14 also includes an automatic variable aperture (AVA) 56 and steering and blanking electrodes 58. Primary beam optical system 14 preferably includes no beam crossovers, thereby avoiding the introduction of significant beam interaction aberration. Scanning electron microscope system 10 is maintained in a vacuum chamber 60 to allow electrons to travel substantially unimpeded to and from the sample. An isolation valve 62 is used to vacuum isolate electron gun 42 from the rest of vacuum chamber 60 to prevent contamination of electron gun 42 when vacuum chamber 60 is exposed to the atmosphere.

The quantity of Auger electrons generated when primary beam 16 impacts sample 20 is strongly dependent on the energy of electrons in primary beam 16. For an acceptable Auger yield, the primary beam preferably has about three times the energy of the most energetic Auger electrons to be detected. Reduced beam energy is often used, however, to reduce damage to delicate samples, such as integrated circuits. A total primary beam accelerating voltage of typically between 2 kV and 20 kV is used, though integrated circuit analysis in a semiconductor Fab typically requires voltages below 5 kV to avoid damaging circuits.

Primary beam optical system 14 includes primary beam deflection system 30 (FIG. 2) that deflects primary beam 16 to scan it, typically in a raster pattern, across part of the surface of sample 20. Primary beam deflection system 30 is preferably supported by objective lens 32. Primary beam deflection system 30 includes a first deflection lens 72, a normal lens 74, and a second deflection lens 76. The voltages across deflection lens 72 and 76 are oscillated to cause the beam to scan in two perpendicular directions to raster across the sample. Normal lens 74 is an optional component used to space the first and second deflection elements.

Primary beam deflection system 30 is preferably floated at a predetermined electrical potential above the electrical potential at sample 20, which is typically at ground potential, that is, at 0 volts. For example, primary beam deflection system 30 may be floated at the anode potential of +2 kV. The floating voltage decelerates the primary electrons between primary beam deflection system 30 and sample 20. Such a floated, primary beam deflection system 30 is described by Krans et al. in Patent Cooperation Treaty Publication No. WO 99/34397.

In an alternate embodiment suitable for an instrument to be used primarily at high magnifications, deflection coils or plates can be placed high in the primary electron beam column, for example, just below the electron beam source 26, in the region of the steering and blanking electrodes 58. Positioning the deflection lenses means outside of the relatively small objective lens entrance area simplifies the construction of the deflection lenses.

Objective lens assembly 32 preferably comprises a snorkel lens 80, which is attached to and supported by the wall of the vacuum chamber 60. Snorkel lens 80 includes a magnetic field generating coil 82, a cone-shaped hollow magnetically permeable member 84 cupped coaxially within the coil 82. The objective lens excitation is preferably operated to produce a magnetic field of about 0.3 Tesla to focus a 5 kV primary beam. The cone-shaped hollow magnetically permeable member 84 of the snorkel objective lens 80 includes a tip 86 proximate to the sample 20. Tip 86 is shaped to extend the magnetic field to immerse sample 20 in the magnetic field, thereby providing a very short working distance and correspondingly high resolution, even at relatively high current densities. The construction and use of snorkel lenses for electron microscopes is known, but before the present invention, such lenses were not successfully combined with an Auger electron spectrometer.

As described above, Auger electrons are emitted approximately isotropically, that is, approximately equally in all directions in a hemisphere above the sample. The trajectories of the secondary electrons are modified by the magnetic field of the objective lens 32 and the voltage on primary beam deflector system 30 as the secondary electrons move away from sample 20 so that a much greater number of electrons are collected through objective lens 32 than would be expected from merely geometric considerations without the electric and magnetic fields. As the Auger electrons pass through objective lens 32, the electrons are diverging, although at a much smaller angle than when originally emitted. Rays 94 show paths of secondary electron through the secondary electron collection system 22. Projecting rays representing the diverging electrons backward, there is a plane at which the diameter of the secondary electron beam represented by the rays is a minimum. In the embodiment shown in FIG. 3, this plane passes near the tip 86 of snorkel lens 80. The cross section of the beam at this point, known as the disk of least confusion, can be treated as a virtual source 88 of Auger electrons. The secondary electron optical system 22 forms an image 90 of virtual source 88 off the primary beam path at an input 150 of a secondary electron detector or analyzer, such as a spherical capacitor analyzer 140.

Figure 4:
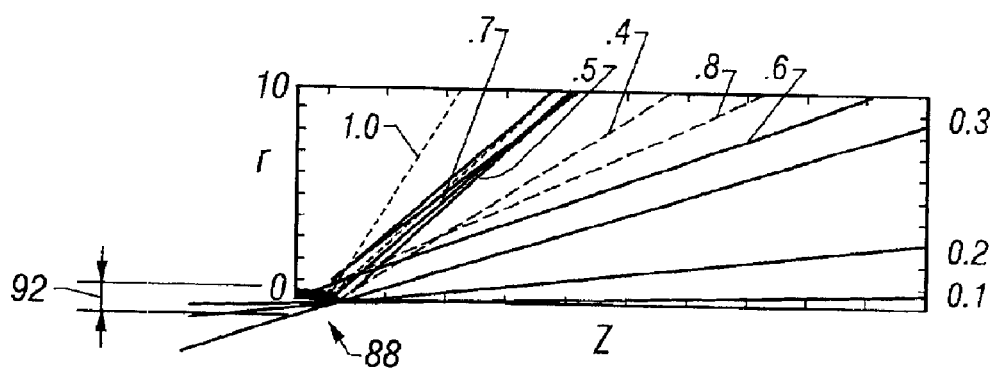
FIG. 4 shows calculated secondary electron trajectories through a snorkel objective lens of the apparatus of FIG. 3.

FIG. 4 shows the calculated trajectories of 1 keV secondary electrons as they travel through snorkel lens 80 (FIG. 3) and shows the rays extrapolated back toward the sample. The secondary electrons are emitted isotropically from the sample, and FIG. 4 shows trajectories on a representative half plane through the optical axis, with the bottom line of FIG. 4 representing the optical axis and the secondary electrons moving from left to right. For the calculating the trajectories shown in FIG. 4, the snorkel lens 80 excitation was 0.29 Tesla and the primary beam voltage was 5 kV. The sample is located at Z=−5 mm and the snorkel lens tip 86 is at Z=0 mm. Extrapolating back to the sample rays of 1,000 V Auger electrons that form angles of 0.1, 0.2, and 0.3 radian with the z axis, FIG. 4 shows that a disk of least confusion having a diameter 92 of about 1.3 mm exists at Z=0. This disk of least confusion is treated as a virtual Auger source 88. Rays having angles greater than 0.3 radian may not be transmitted through the secondary electron optical system 22 in large numbers and are ignored.

Since the primary beam deflection system 30 is biased about 2 kV, it accelerates the secondary electrons emitted from the sample, thereby reducing the angle of the secondary electrons passing through objective lens 32 and allowing a greater percentage of the isotropically emitted secondary electrons to be collected. Moreover, the voltages on deflection electrodes 72 and 76, which bend the primary beam toward the impact point conversely straighten the secondary electron trajectories from the impact point to align them with the primary beam axis above the objective lens. Primary and secondary electrons can be shielded from magnetic fields away from tip 86 by a shield 96 (FIG. 3) constructed of a metal having a high magnetic permeability, that is, a mumetal.

After being accelerated by the primary beam deflection system 30, secondary electrons are deflected off the primary beam path by secondary electron deflector 34 (FIG. 2). Deflecting the secondary electrons from the primary beam axis obviates the need for the emitted secondary electrons to stay confined all the way through the primary beam optical system 14. A deflector having a relatively large input is required to collect and focus electrons from the relatively large virtual Auger source 88 without excessive loss of electrons. Secondary electron deflector 34 comprises for example, an electrostatic deflector such as an electrostatic capacitor, and preferably a symmetric, 180 degree spherical capacitor, shown in FIG. 3 as a transfer spherical capacitor 98. Transfer spherical capacitor 98 has a spherical configuration with an average radius of 75 mm and has an inner sphere 100 and an outer sphere 102. By accepting input over a large solid angle, transfer spherical capacitor 98 reduces transmission losses. Other deflection means, such as cylindrical or toroidal plates, could be used to deflect secondary electrons.

The voltage across transfer spherical capacitor 98 determines which Auger electrons are passed through to the detector or analyzer. To pass the full range of Auger electrons of interest (about 50 V to 3000 V), transfer spherical capacitor 98 is typically scanned across a range of voltages. For example, with 2000 V acceleration potential, inner hemisphere 100 may scan a range of voltage between 2073 V and 6408 V, and an outer hemisphere 102 may scan a range of voltage between 1987 V and 1217 V, with the voltage difference between the hemispheres being varied between 73 V and 4408 V.

Figure 5A:
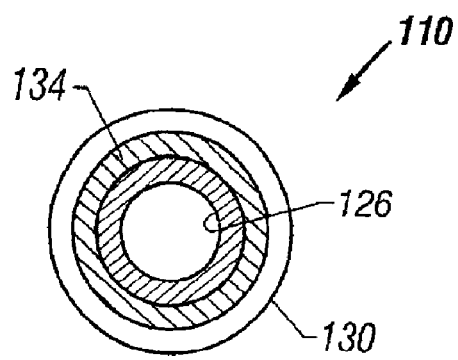
FIG. 5A shows a cross-sectional top view of a n exemplary drift tube of FIG. 3.
Figure 5B:
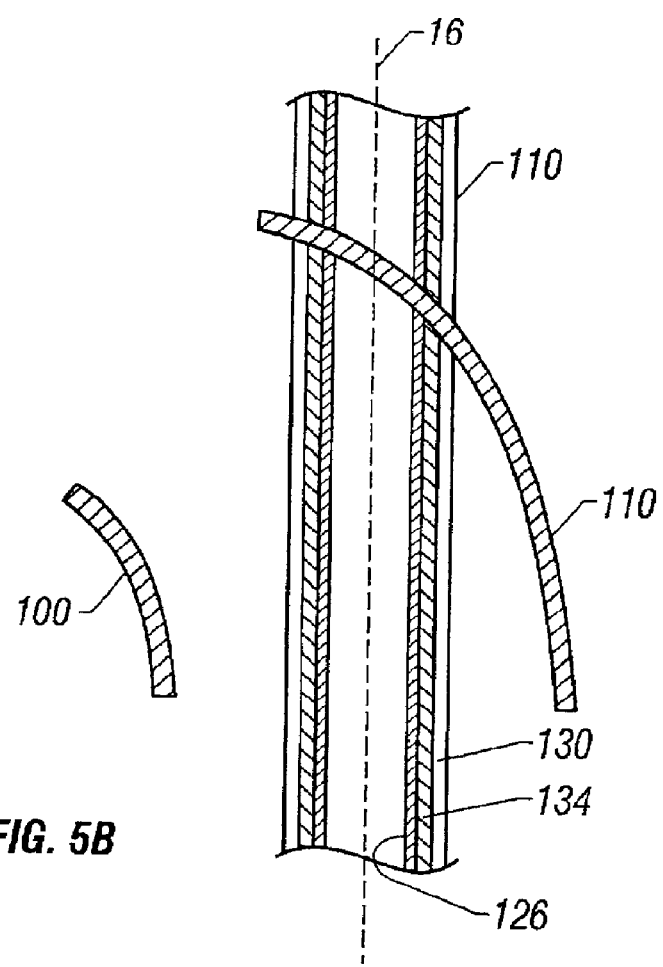
FIG. 5B shows a partial cross-sectional elevation view of an exemplary drift tube and transfer spherical capacitor of FIG. 3.

Fields used by secondary electron deflector 34 (FIG. 2) to deflect Auger electrons would cause unacceptable aberration of the primary beam. Shield 40 protects primary beam 16 from fields associated with secondary electron deflector 34. A preferred shield 40 comprises a drift tube 110 (FIG. 3) that extends from near anode 50 to objective lens 32 and protects the primary beam 16 from the fields of deflector system 34 as the primary beam 16 travels towards the sample 20. FIGS. 5A and 5B illustrate a cross-sectional top view and a cross-sectional partial elevation view, respectively, of the drift tube 110. Drift tube 110 is internally conductive to shield the primary electron beam 16 from external electric fields and can be held at an electrical potential corresponding to the potential that would exist at that location absent primary beam deflection system 30. For example, the drift tube interior may be held at the +2 kV potential of anode 50 and primary beam deflection system 30. Externally, drift tube 110 has a graded potential to match the electric field of the transfer spherical capacitor 98, so that the secondary electron orbits in the transfer spherical capacitor 98 are not disturbed by the presence of the drift tube 110 therein. The graded potential can be achieved, for example, by applying a voltage across a resistive exterior coating. FIG. 5A depicts a cross-sectional view from the top of the drift tube 110 having a conductive interior 126 and semi-conductive or high-impedance resistive exterior 130. The conductive interior 126 comprises a suitable conductive metal and is separated from the resistive exterior 130 by an insulator layer 134.

Drift tube 110 could be formed using known technology from the fabrication of flexible printed circuit boards, with a conductive layer on one side of the substrate material and a resistive film on the other. The flexible printed circuit board includes a thin conductive film to bleed away the electron charge, which strikes the drift tube 110. Alternatively, a ceramic or other dielectric tube could be used as insulator layer 134. The interior layer could be formed by attaching or evaporating a metal layer onto the interior surface. Similarly, the exterior surface could comprise metal stripes with a semiconductive layer outside, formed, for example, by evaporating a resistive film through a template onto an insulating layer.

In an alternate embodiment, instead of drift tube 110, parallel plates are disposed on both sides of the primary electron beam 16 for protection from the electrostatic field of the transfer spherical capacitor 98. These plates are parallel to a plane defined by the primary electron beam 16 and the input axis of the secondary electron detector or analyzer 38. The plates are electrically conductive on the inner side facing the primary electron beam 16 and have graded fields on their outer surfaces. The graded field can be formed as described above with respect to the drift tube 110. Since these plates are substantially parallel to the electron orbits as they are bent towards the transfer lens 36, loss of Auger electron signal due to the presence of relatively thin parallel plates can be minimal.

Transfer spherical capacitor 98 is symmetric, that is, it produces an image that is identical to the incoming object, other than unavoidable aberration, but in a different location. The angle with respect to the spherical capacitor 98 optical axis of electron rays leaving transfer spherical capacitor 98 is the same as the angle of the rays entering the capacitor 98, approximately 0.1 radian for 1,000 eV Auger electrons. This exit angle is typically mismatched to the admittance angle of the secondary electron detector or analyzer 38 and transfer lens 36 is used to modify the image to match the admittance angle. Transfer lens 36 typically has a magnification, M, of about four. This magnification increases the image widths, but decreases the output angles of the transfer lens 36. The voltage across the transfer lens 36, like the voltages across the transfer spherical capacitor, is swept to correspond to the Auger energy being analyzed.

Any type of electron energy analyzer can be used. A preferred secondary electron detector and analyzer comprises spherical capacitor analyzer 140, similar in design to transfer spherical capacitor described above, but having an average radius of 100 mm and having full hemispherical design.

In scanning electron microscopy imaging mode, as opposed to Auger electron spectroscopy mode, forming an image depends on collecting secondary electrons having energies, on the order of a few eV. In the embodiment described above, the low energy secondary electrons will be highly collimated as they pass through the snorkel lens 80, and a significant number of low energy electrons will pass inside the drift tube 110 instead of being deflected toward a detector and away from the path of the primary beam by transfer spherical capacitor 98. One method of preventing the low energy secondary electrons from passing through drift tube 110 is to turn off or greatly reduce the acceleration voltage on primary beam deflection system 30 during SEM imaging. The low energy secondary electrons are then not so highly collimated and most will bypass drift tube 10 and be deflected from the primary electron beam path for detection.

Method of Operation

Figure 6:
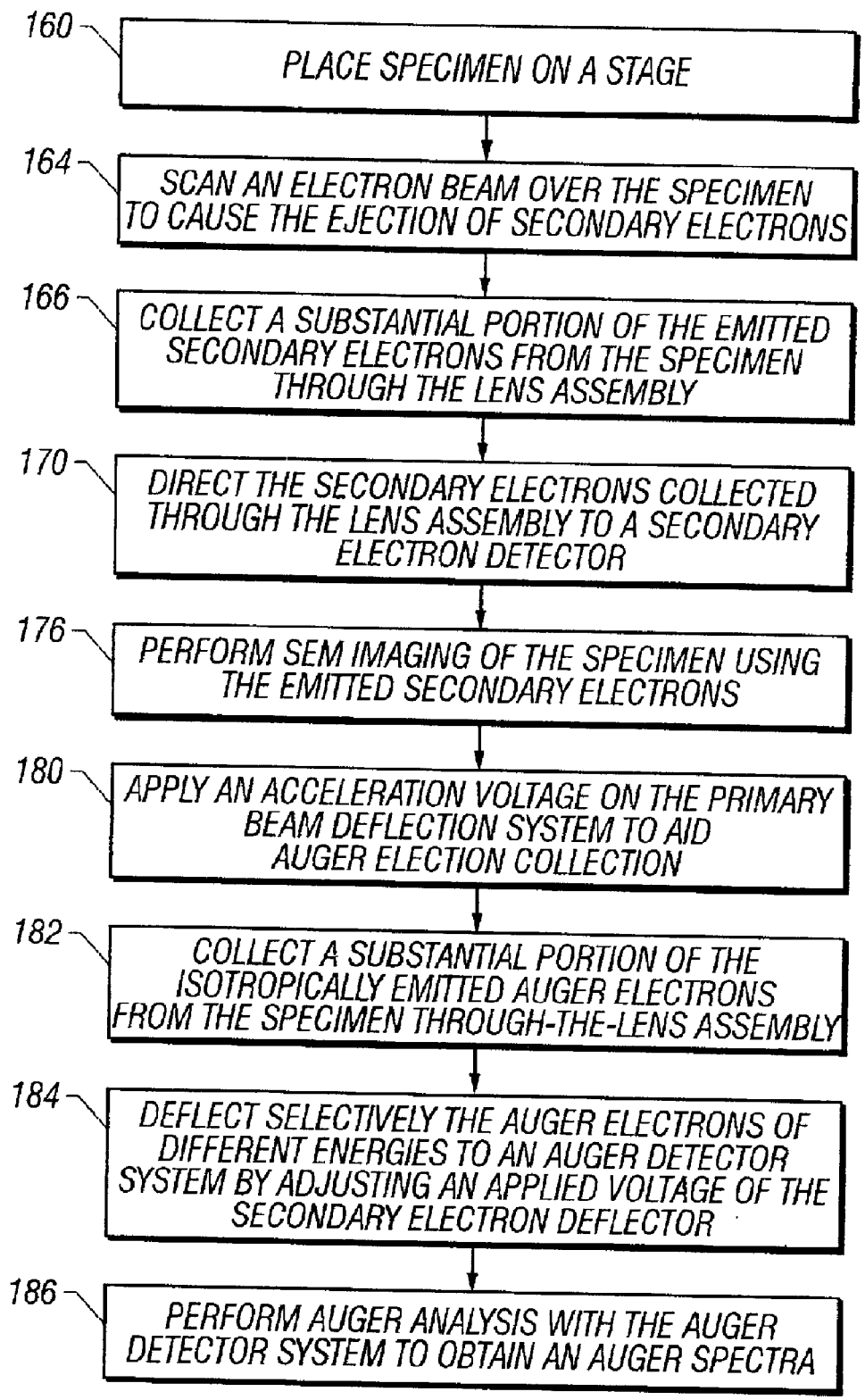
FIG. 6 is a flow chart showing a method of performing SEM imaging and Auger analysis operations on a specimen in one embodiment of the present invention.

FIG. 6 is a flow chart showing the steps in a process for performing SEM imaging and Auger analysis operations on a sample 20 in one embodiment of the present invention.

Step 160 shows that the sample 20 is placed on a movable stage in vacuum chamber 60, which is then evacuated. Step 164 shows that the operator scans primary electron beam 16 of sufficient energy over the sample 20 to cause the emission of secondary electrons for imaging. To reduce sample damage, the primary beam energy in step 164 can be less than that required for Auger analysis. Step 166 shows that a substantial portion of the low energy secondary electrons emitted from the sample 20 are collected through objective lens 32. Step 170 shows that the collected low energy secondary electrons are directed to a secondary electron detector. For step 170, the acceleration voltage on the primary beam deflection system 30 may be turned off or substantially reduced.

Step 176 shows that SEM imaging of the sample 20 is performed using the detected secondary electrons. For example, features of the sample 20 identifiable through the SEM imaging can be used to navigate around the sample 20 and locate a target feature for Auger analysis.

Step 180 shows that an acceleration voltage is applied on the primary beam deflection system 30 to aid Auger electron collection. Step 182 shows that a substantial portion of the emitted Auger electrons from the sample 20 are collected through objective lens 32. Step 184 shows the Auger electrons within a desired energy range are selectively deflected to the electron detector or analyzer 38 by adjusting an applied voltage of secondary electron deflector 34. The transfer lens 36 adapts the mapped Auger image before it is input to electron detector or analyzer 38 for Auger analysis. In step 186, the operator performs an Auger analysis and determines from the Auger spectra of the received Auger electrons the type of material from which the electrons were emitted.

Specification and Performance Estimates for a Preferred Embodiment

Below are estimates of the transmission efficiency of 100 V and 1000 V Auger electrons in the above-described secondary electron collection system. The equations used to determine characteristics of the transfer spherical capacitor and the spherical capacitor analyzer are described in E. M. Purcell entitled "The Focusing of Charged particles by a Spherical Condenser" in *Phys. Rev.* 54, pp. 818–826 (1938).

Input Lens

The transmission T of Auger electrons through the snorkel lens 80 and accelerating primary beam deflection system 30 is given by:

$$T = 100 AR\, A_i^2 / Z \quad (1)$$

where $A_i$ is the half angle of Auger electrons from the sample without electrostatic acceleration and without parallization by the magnetic lens, AR is the Acceleration Ratio, defined as the ratio of the total electron energy after acceleration to the Auger electron energy upon emission, and T is the percentage of the $2\pi$ solid angle of Auger electrons emitted by the sample 20 that pass thorough the snorkel lens 80 and primary beam deflection system 30 with half-angle less than $A_i$. A uniform angular distribution of emitted Auger electrons from the sample 20 is assumed.

For example, for 1,000 V Auger electrons, assuming a 5 kV primary beam, sufficient magnetic lens excitation to focus the primary electron beam, and a double crossover of the Auger electrons after leaving the sample, the input angle $A_i$ without acceleration is estimated to be 0.3 radians. A 2,000 V acceleration by the electrostatic lens gives an acceleration ratio of 3. For a 0.1 radian cone of 1,000 eV Auger electrons, Equation 1 gives a transmission T of approximately 13.8 percent. Reducing the 13.8 percent by 20 percent to account for the estimated loss of electrons in the drift tube 110 provides a transmission of 10.8 percent. A similar calculation can be performed for 100 eV Auger electrons which yields a transmission efficiency of 75.6 percent. Although applicants have conservatively estimated $A_i$ to be 0.3 radians for 100 eV Auger electrons also, $A_i$, is likely to be much larger for 100 V electrons, resulting in greater overall transmission efficiency than shown. Table 1 below summarizes the factors that related to the transmission of 1000 eV Auger electrons and 100 eV Auger electrons. $E_A$ is the Auger electron energy, $D_o$ is the Auger object size 92 as shown in FIG. 4 near the pole face of the snorkel lens 80, and $A_o$ is the half angle of the Auger electrons after snorkel lens and electrostatic acceleration lenses.

TABLE 1

SNOR & ACCEL. LENSES

| $E_A$ (ev) | $D_o$ (mm) | $A_i$ (rad) | $A_o$ (rad) | Accel Ratio | T (%) |
|---|---|---|---|---|---|
| 1000 | 1.3 | 0.3 | 0.1 | 3 | 10.8 |
| 100 | 1 | 0.3 | 0.1 | 21 | 75.6 |

Transfer Spherical Capacitor

Figure 7:
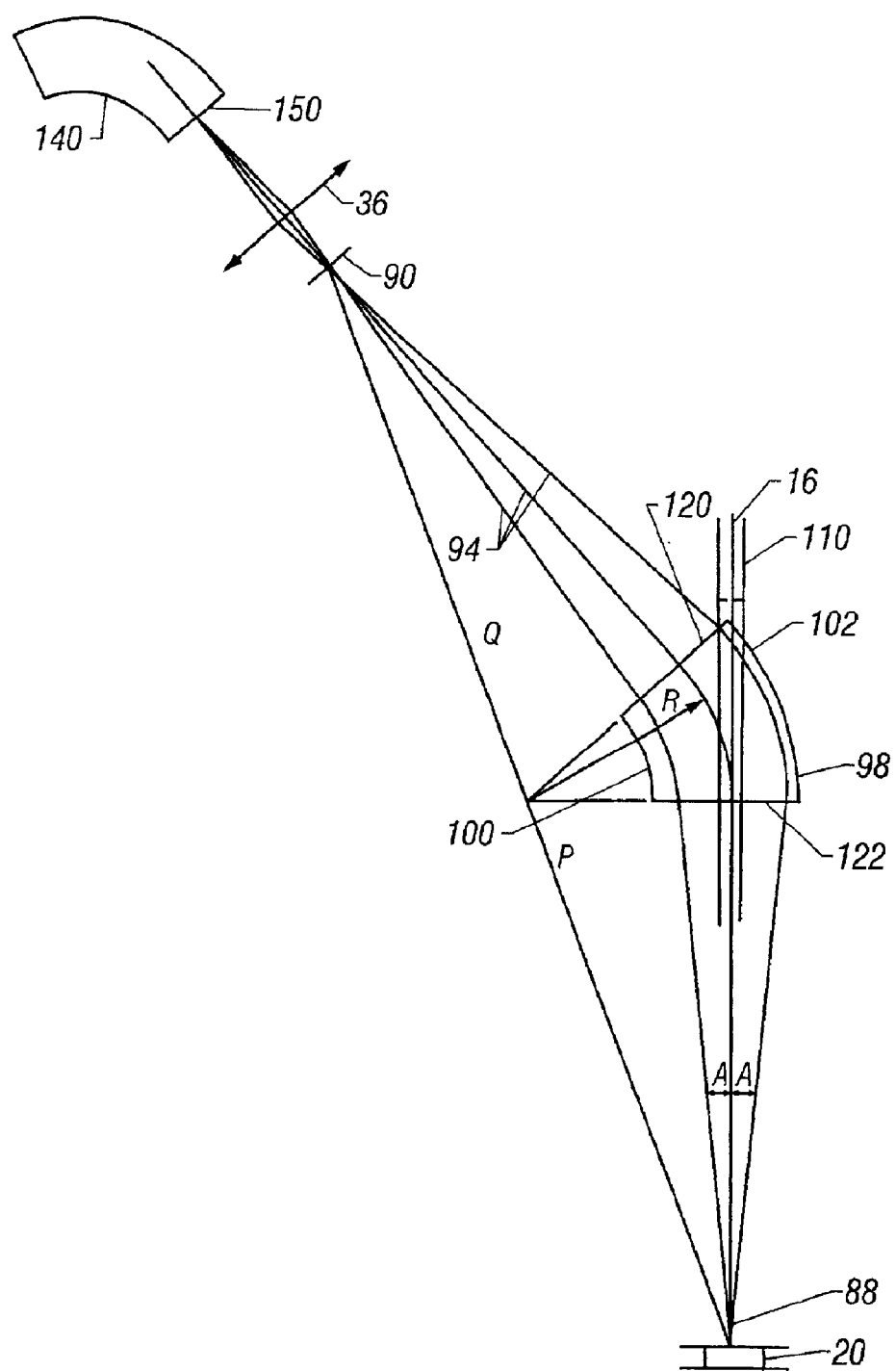
FIG. 7 illustrates imaging characteristics of a symmetric spherical analyzer employed as a transfer spherical capacitor for electrostatic deflection of secondary electrons in one embodiment of the present invention.

FIG. 7 illustrates imaging characteristics of a transfer spherical capacitor 98 having an average radius, R, of about 75 mm. The spherical capacitor is symmetric and emits electrons at its output at the same angle (about 0.1 radians) that it accepts electrons at its entrance. A ray drawn along a normal from the Auger object 88 to an Auger image 90 passes through the center of the transfer spherical capacitor 98. Transfer spherical capacitor 98 is swept in voltage in accordance with the Auger energy being analyzed.

Figure 8A:
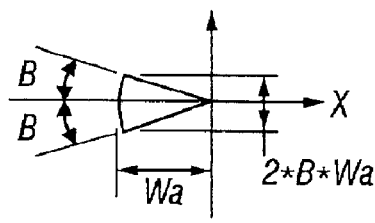
FIGS. 8A–8C show the aberration inherent in a spherical capacitor on the image of a point source.
Figure 8B:
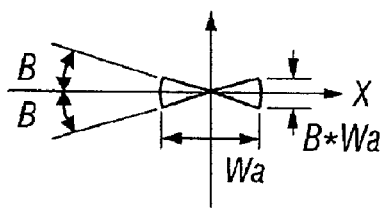
Figure 8C:
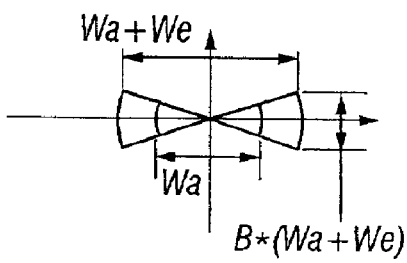
Figure 8D:
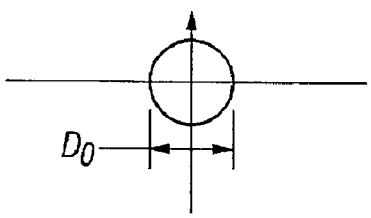
FIG. 8D shows a virtual Auger object having a finite diameter.
Figure 8E:
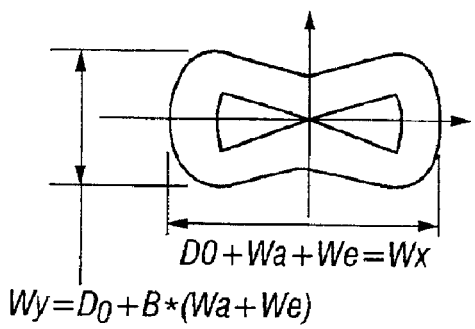
FIG. 8E shows an enlarged image of the Auger object of FIG. 8D and incorporating various aberrations inherent in a spherical capacitor as shown in FIGS. 8A to 8C.

FIGS. 8A–8C show the aberrations inherent in a spherical capacitor on an image of a point source. FIG. 8D shows an Auger source, which has a radius $D_O$ and is not, therefore, a point source. FIG. 8E shows the effect of the aberration of the spherical capacitor on the image 90 of the extended Auger source 88.

FIG. 8A illustrates the geometric aberration in transfer spherical capacitor 98. If the applied voltages on transfer spherical capacitor 98 are tuned to focus a point source from the input to a point on the output axis for a small but finite input half-angle A (FIGS. 3 and 7), the geometric aberration causes the output Auger image 90 to take the pie shape shown in FIG. 8A. The pie shape arises from those Auger electron trajectories passing through planes through lines P and Q (FIG. 7), but not in the plane of FIG. 8A.

Figure 9:
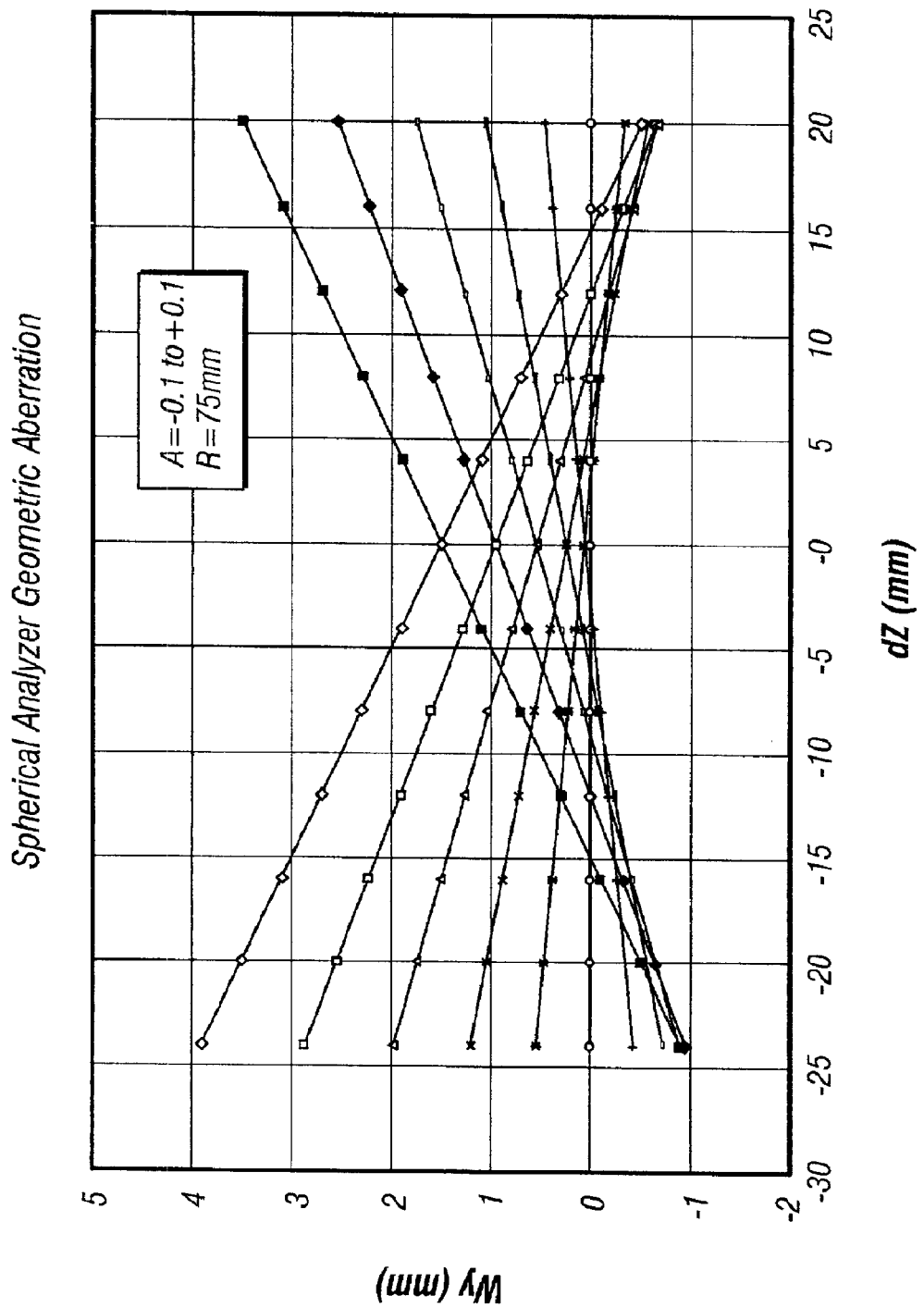
FIG. 9 shows exemplary Auger electron trajectories through the transfer spherical capacitor of the apparatus of FIG. 3.

FIG. 9 depicts Auger electron trajectories through transfer spherical capacitor 98. As shown in FIG. 9, the minimum beam width $W_A$ for $A_i$=0.1 radian and R=75 mm is about 1.5 mm and the highest concentration of rays in the beam is at $W_y$=0. Thus, the largest current density corresponds to the right-hand side (apex) of the pie shaped Auger image of FIG. 8A.

The geometric aberration, $W_A$, in the X directions for symmetric spherical capacitor 98 is given by:

$$W_A = 2\,AR\,A^2 \tag{2}$$

And the beam spread in the y direction as shown in FIG. 8A is $$W_y = 2\,B\,W_A. \tag{3}$$

where the angle B, the half angle in the y direction is given by:

$$B = c/R \tag{4}$$

where c is the half-width of the beam exiting the transfer spherical capacitor 98. In the embodiment described, B is approximately 0.25 radian.

By varying the applied deflecting voltage between the inner and outer hemispheres 100 and 102 (FIG. 7) to slightly decrease the electric field across the transfer spherical capacitor 98, one can offset the pie-shaped image of FIG. 8A to produce the bow-tie shaped image shown in FIG. 8B. The width in the Y-direction is thereby reduced from 2 B $W_A$ to B $W_A$. The reduced width helps to maximize the performance of spherical capacitor analyzer 140.

The image of the Auger source is also enlarged by chromatic aberration. FIG. 8C shows the chromatic aberration added to the bow-tie of FIG. 8B for n channels in the spherical capacitor analyzer 140. The chromatic spread $W_E$ at the image plane 90 is given by $$W_E = n(dE_A/E_A)2R/(AR) \tag{5}$$

where n is the number of analyzer channels, in this example, 5, $dE_A$ is the width of the Auger electron energy band analyzed per detector channel, R is the average radius of the spherical capacitor, and AR is the acceleration ratio describe above. $dE_A/E_A$ represents the normalized analyzed energy width per channel of the Auger electron spectrometer and is typically about 0.5 percent.

FIG. 8C shows that the Auger image subject to geometric aberration and chromatic aberration has a width in the x direction of $W_A + W_E$ and in the Y direction of B ($W_A + W_E$). FIG. 8C assumes that the channels are evenly balanced on either side of the mono-energetic case of FIG. 8B. Hence the bow tie in FIG. 8C is enlarged by $W_E/2$ on both ends in the X-direction. The bow tie also is enlarged in the Y-direction by B $W_E$.

FIG. 8D shows the virtual Auger source 88 at the snorkel lens 80 having a diameter of $D_O$, and FIG. 8E shows the beam width as a result of the finite extent of the Auger source and all aberrations up to and including transfer spherical capacitor 98. The dimensions of the image are:

$$W_X = D_o + W_A + W_E \tag{6}$$

$$W_y = D_o + B(W_A + W_E) \tag{7}$$

Transfer spherical capacitor 98, being symmetric, transmits the Auger electrons at the same angle (about 0.1 radian) at its exit 120 as it receives them at its entrance 122. Transfer spherical capacitor 98 and transfer lens 36 are swept through a range of voltages determined by the Auger energies being analyzed. A negative deflecting voltage relative to inner sphere 100 is applied to outer sphere 102 to generate an electric field to steer the Auger electrons substantially away from the primary electron beam 16. The Auger electrons are focused and decelerated by transfer lens 36 to the entrance 150 of spherical capacitor analyzer 140. The Auger electron trajectories between hemispheres 100 and 102 depend on the electron energies and the difference in applied voltages between the hemispheres. Both spheres are floated at 2 kV, the same voltage as anode 50. Notice that the image is narrower in the Y direction, that is, $W_Y < W_X$, and it is desirable, therefore, to place $W_Y$ in the dispersion direction of spherical capacitor analyzer 140 to optimize its performance. Table 2 below summarizes the properties of the Auger image exiting the spherical capacitor for Auger electrons having energy of 1,000 eV and 100 eV and an acceleration potential of 2000 V.

TABLE 2

TRANSFER SPHERICAL CAPACITOR

| $E_A$ (ev) | R (mm) | $W_A$ (mm) | $W_E$ (mm) | $W_X$ (mm) | $W_Y$ (mm) |
|---|---|---|---|---|---|
| 1000 | 75 | 1.5 | 1.25 | 4.05 | 1.99 |
| 100 | 75 | 1.5 | 0.18 | 2.68 | 1.42 |

Transfer Lens

Because the output angle of the transfer spherical capacitor does not typically match the admittance angle of spherical capacitor analyzer 140, a suitable admittance matching transfer lens 36 is required between the spherical capacitors. In the described embodiment, transfer lens 36 has a magnification of four, although the magnification will vary depending on the properties of other components in secondary electron optical system 22. Transfer lens 36 typically increases the output image widths $W_X$ and $W_Y$, but decreases the output angles. The angle at which the beam enters the spherical capacitor analyzer, $A_{OY}$, is then decreased again by the retarding ratio according to the equation:

$$A_{OY} = A_O (RR)^{1/2} / M \tag{8}$$

where $A_{OY}$ is the output angle from the transfer lens, RR is the retard ratio, which is defined as:

$$RR = (AR)(dV_S/V_S)/(dE_A/E_A) \tag{9}$$

where $dV_S/V_S$ is the normalized energy resolution of the spherical capacitor analyzer and is typically about 3.5%.

The trace width output of the transfer lens is $M\, W_Y$.

The geometric and chromatic aberration contributions by the transfer lens are assumed to be negligible.

Table 3 below shows the characteristics of the transfer lens for 100 V and for 1000 V Auger electrons

TABLE 3

TRANSFER LENS

| $E_A$ (ev) | M | Retard Ratio | Aoy (rad) | Woy (mm) |
|---|---|---|---|---|
| 1000 | 4.00 | 21 | 0.11 | 7.95 |
| 100 | 4.00 | 147 | 0.30 | 5.68 |

Spherical Capacitor Analyzer

The resolution of the SCA is determined by its radius R and input half-angle $A_Y$ as described in equations presented in a paper by H. Z. Sar-El entitled "Criterion for Comparing Analyzers" in *Rev. Sci. Instrum.* Vol. 41, No. 4,561–564 (1970). The resolution is calculated as:

$$(dV_S/V_S)_{BW} = W_{slit}/R + A_{SCA}^2 \tag{10}$$

where $(dV_S/V_S)_{BW}$ is defined as the base width energy resolution, $A_{SCA}$ is the allowed half-angle into the SCA in the Y-direction, and $W_{slit}$ is the slit width, where entrance and exit slits (for a single channel) are equal. The full-width half-maximum (FWHM) energy resolution can be estimated as half of the base resolution given in Equation (10), resulting in $$(dV_S/V_S)_{FWHM} = W_{slit}/2R + A_{SCA}^2/2 \tag{11}$$

For example, a preferred 100 mm radius spherical capacitor analyzer has the following characteristics: slit width=4 mm; slit length=10 mm; $A_{SCA}$=0.1 radian; and $A_X$=1.6 radian. Thus Equation (11) gives $(dV_S/V_S)_{FWHM}$=4/200+ $0.1^2/2$=2.5%. If an Auger energy resolution of 0.5% is desired, 1 kV Auger electrons can be retarded to 250 V by a retarding ratio of 5. However, since the 1 kV Auger electrons were previously accelerated to 3 kV by the primary beam deflection system 30, it is necessary to decelerate the Auger electrons by 15 times between the transfer lens 36 and the spherical capacitor analyzer 140 to obtain 250 V electrons.

For the spherical capacitor analyzer:

$$W_A = 2\, R\, A_{SCA}^2 \tag{12}$$

$$W_{SLIT} = 2R(dV_S/V_S - A_{SCA}^2/2) \tag{13}$$

where equation 13 is obtained by rearranging equation 11.

Table 4 shows the characteristics of the 100 mm radius spherical capacitor analyzer for 100 V and 1000 V electrons, where the slit width $W_{slit}$ is chosen to be 6 mm.

TABLE 4

SPHERICAL CAP. ANALYZER

| $E_A$ | dVs/Vs (%) | $A_{OY}$ (rad) | R (mm) | $A_{SCA}$ (rad) | Wa (mm) | Wslit (mm) |
|---|---|---|---|---|---|---|
| 1000 | 3.50 | 0.11 | 100 | 0.10 | 2.0 | 6.0 |
| 100 | 3.50 | 0.30 | 100 | 0.10 | 2.0 | 6.0 |

The overall transmission of the components are shown below in Table 5, where $$\text{Angle } T = T\, A_{OY}/A_{SCA} \tag{14}$$

$$\text{Area } T = W_{OY}/W_{SLIT} \tag{15}$$

$$\text{Total } T = (\text{Area } T)(\text{Angle } T) \tag{16}$$

Angle T is the percentage of the solid angle passed by the snorkel lens 80 and associated electrostatic lenses, plus the transfer SCA and transfer lens.

Area T is the percentage of the magnified and aberrated Auger object 88, which is passed by entrance 150 of spherical capacitor analyzer 140 for analysis.

TABLE 5

TRANSMISSION TOTALS

| $E_A$ | Area T (%) | Angle T (%) | Total T (%) |
|---|---|---|---|
| 1000 | 75.5 | 9.4 | 7.1 |
| 100 | 100.0 | 24.9 | 24.9 |

Using a five channel Auger detector system 12, approximately five times the 7.1% transmission or 35.5% of the Auger electrons are transmitted to the spherical capacitor analyzer.

It can be shown that the transmission efficiency varies with the Auger energy, a phenomenon referred to as "phase space oscillation." This variation in efficiency can be compensated in several ways, such as by limiting the input angles of the secondary electrons, by normalizing the Auger electron signal, or by a combination of these two. In one embodiment, the angles of secondary and Auger electrons can be limited before they enter the snorkel lens 80 to approximately 0.21 radian, for example, by placing a non-magnetic aperture to the specimen side of the snorkel lens 80. To compensate using normalization, the Auger electron signal can be normalized to the background signal using a function, which is smoothed over large energies, for example, approximately 100 eV.

Comparison of the Preferred Embodiment with the Prior Art

Figure 10:
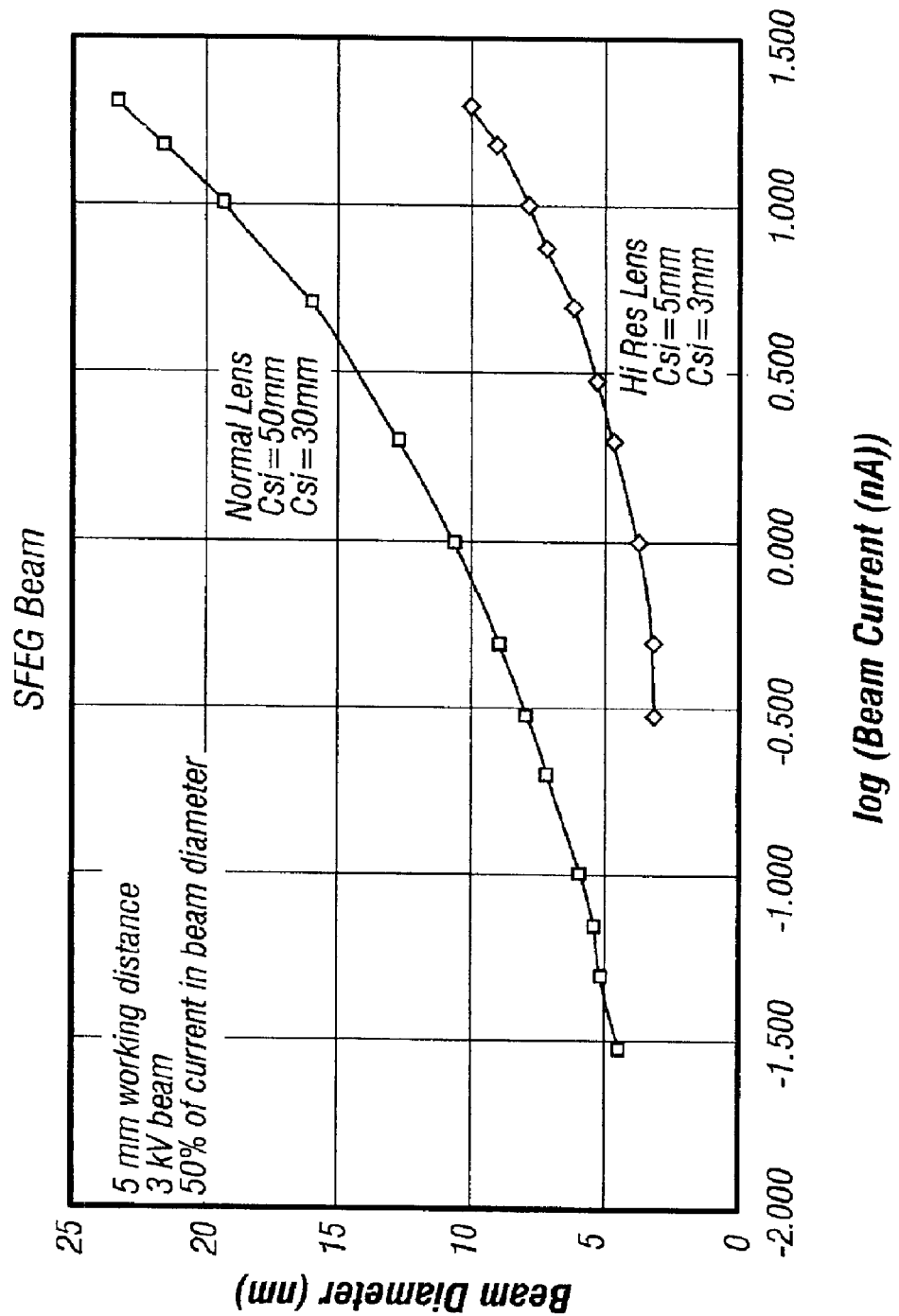
FIG. 10 is a graph showing the beam current for a beam of a specified diameter for a high resolution snorkel objective lens and a less optimal magnetic lens for use with a side mounted Auger analyzer.

FIG. 10 is a graph showing for a conventional (non-immersion) magnetic objective lens and for a high resolution lens the primary beam diameter versus the beam current for a primary electron beam from a Schottky field emission gun. For FIG. 10, the beam diameter is defined as the radius enclosing 50% of the beam current. The graph assumes a 5 kV beam and a 5 mm working distance. The normal objective lens has a coefficient of spherical aberration ($C_{Si}$) of 50 mm and a coefficient of chromatic aberration ($C_{Ci}$) of 30 mm, whereas the high resolution lens has a $C_{Si}$ of 5 mm and a $C_{Ci}$ of 3 mm. FIG. 10 shows that for a 10 nm diameter beam, the beam current is about 20 times greater using the high resolution lens.

By providing a secondary electron collection system that is compatible with a high resolution lens, the present invention can perform Auger analysis approximately 20 times faster than a prior art system using the same beam diameter, assuming that the efficiency of transmission of the electrons from the sample to the analyzer is the same in both the cases. As shown above, the present invention provides excellent transmission efficiency. Although reduced transmission efficiency can be compensated by increasing the primary beam current, increased primary beam current can damage the sample 20.

The input lenses of conventional standard SCA systems typically collects up to a 12 degree half-angle, which corresponds to about 2% input transmission (assuming no losses in the input lenses). Multiple channels in a spherical capacitor analyzer increase the transmission geometrically. For example, a commercially available Auger spectrometer system from Physical Electronics, Inc., Eden Prairie, Minn., has effectively about 16 channels in the Auger detector and provides approximately 32% effective transmission, assuming no losses in the input lenses of the Auger spectrometer system. In spherical capacitor analyzer 140 of the inventive system described above, a five channel Auger detector system 12, provides approximately 35.5% transmission in the through-the-lens (TTL) SEM/Auger system for 1 keV Auger electrons.

Alternative Embodiment of Secondary Electron Collection System

Figure 11:
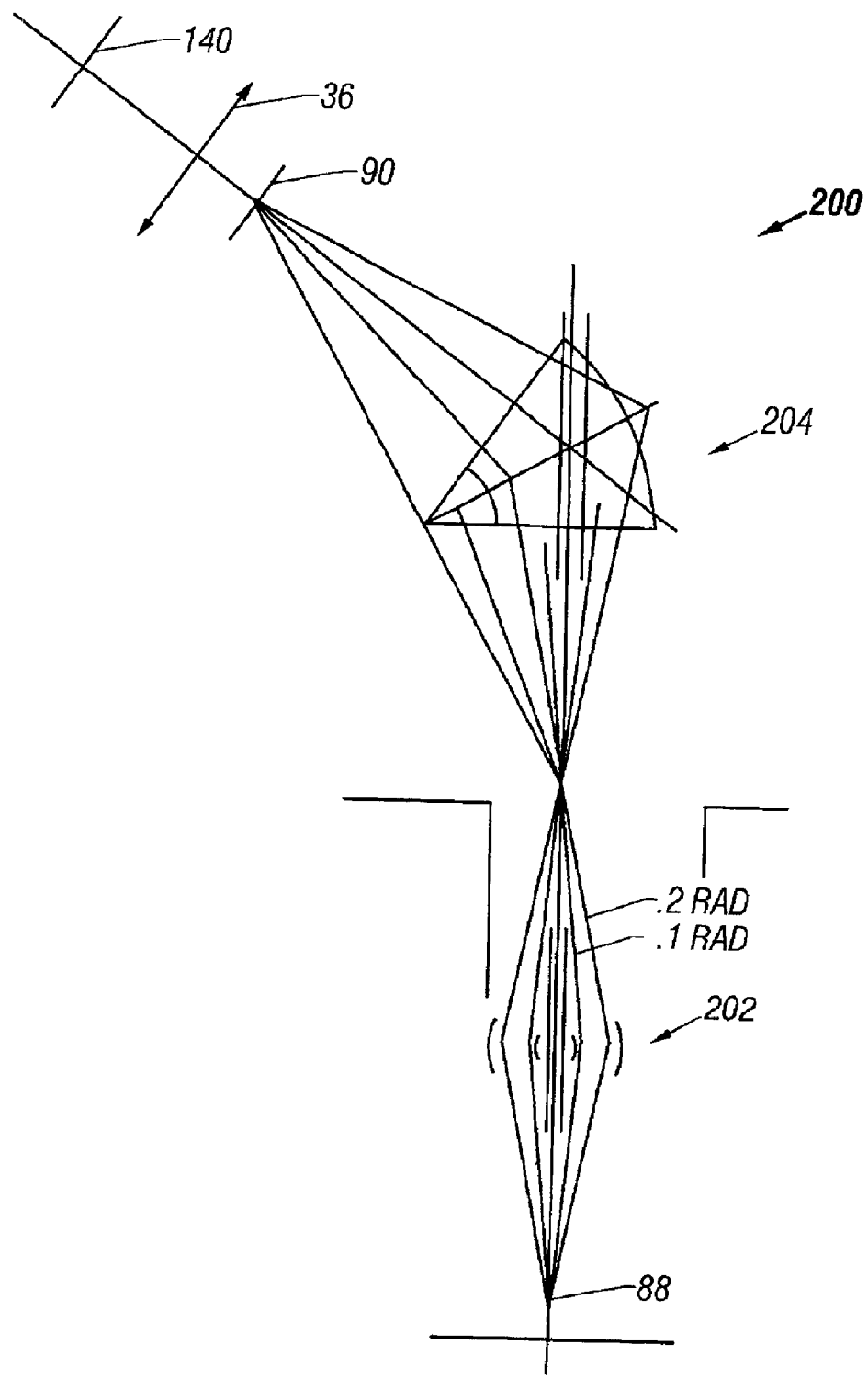
FIG. 11 is a schematic representation of an alternate embodiment of a scanning electron microscope apparatus having a through-the-lens Auger detector and using a second transfer spherical capacitor.

FIG. 11 depicts an alternative secondary electron collection system 200 that transfers an even larger percentage of the isotropically emitted Auger electrons to the analyzer. The embodiment of FIG. 11 employs two transfer spherical capacitors 202 and 204. As a result, the 1 kV Auger electrons have about twice the total transmission. Secondary electron collection system 200 accepts secondary electrons from an input angle of 0.2 radians, twice the input angle of the single transfer spherical capacitor system of FIG. 3. FIG. 11 identifies rays having angles of 0.1 radians and 0.2 radians emitted from the snorkel and acceleration lenses.

Specification and performance information for the embodiment of FIG. 11 is described below in tables, analogous to those shown above for the FIG. 3 embodiment. The same parameter names are used to specify properties of the system and so are not explained again.

The following parameters characterize the system:

B=0.3 Rad $V_{Accel}$=2000 V $DE_A/E_A$=0.5%

$A_{SCA}$=0.10 rad $dV_S/V_S$=8%

M=8.00 n=5

TABLE 6

SNOR & ACCELERATION LENSES

| $E_A$ | $D_o$ (mm) | $A_i$ (rad) | $A_o$ (rad) | AR | T (%) |
|---|---|---|---|---|---|
| 1000 | 1.3 | 0.6 | 0.2 | 3 | 43.2 |
| 100 | 1 | 0.6 | 0.2 | 21 | 100 |

$A_n$ assumes a 5 kV primary beam and a double crossover condition for the Auger electrons. Although applicants have conservatively estimated $A_i$ to be 0.6 radians for 100 V Auger electron also, $A_i$ is likely to be much larger, resulting in greater overall transmission efficiency.

TABLE 7

FIRST TRANSFER SPHERICAL CAPACITOR

| $E_A$ | R (mm) | $W_a$ (mm) | $W_e$ (mm) | $W_x$ (mm) | $W_y$ (mm) |
|---|---|---|---|---|---|
| 1000 | 15 | 1.20 | 0.25 | 2.75 | 1.74 |
| 100 | 15 | 1.20 | 0.04 | 2.24 | 1.37 |

TABLE 8

SECOND TRANSFER SPHERICAL CAPACITOR

| $E_A$ | R (mm) | $W_a$ (mm) | $W_e$ (mm) | $W_x$ (mm) | $W_y$ (mm) |
|---|---|---|---|---|---|
| 1000 | 50 | 4.00 | 0.83 | 7.58 | 3.19 |
| 100 | 50 | 4.00 | 0.12 | 6.35 | 2.61 |

TABLE 9

TRANSFER LENS

| $E_A$ | M | Retard Ratio | $A_{ov}$ (rad) | $W_{ov}$ (mm) |
|---|---|---|---|---|
| 1000 | 8.00 | 48 | 0.17 | 25.48 |
| 100 | 8.00 | 336 | 0.46 | 20.85 |

TABLE 10

SPHERICAL CAPACITOR ANALYZER

| $E_A$ | dVs/Vs (%) | $A_{OY}$ (rad) | R (mm) | $A_{sca}$ (rad) | $W_a$ (mm) | $W_{slit}$ (mm) |
|---|---|---|---|---|---|---|
| 1000 | 8.00 | 0.17 | 100 | 0.10 | 2 | 15.0 |
| 100 | 8.00 | 0.46 | 100 | 0.10 | 2 | 15.0 |

TABLE 11

TRANSMISSION TOTALS

| $E_A$ | Area T (%) | Angle T (%) | Total T (%) |
|---|---|---|---|
| 1000 | 58.9 | 24.8 | 14.7 |
| 100 | 71.9 | 21.8 | 15.7 |

Embodiment Using Alternative Objective Lens

Figure 12:
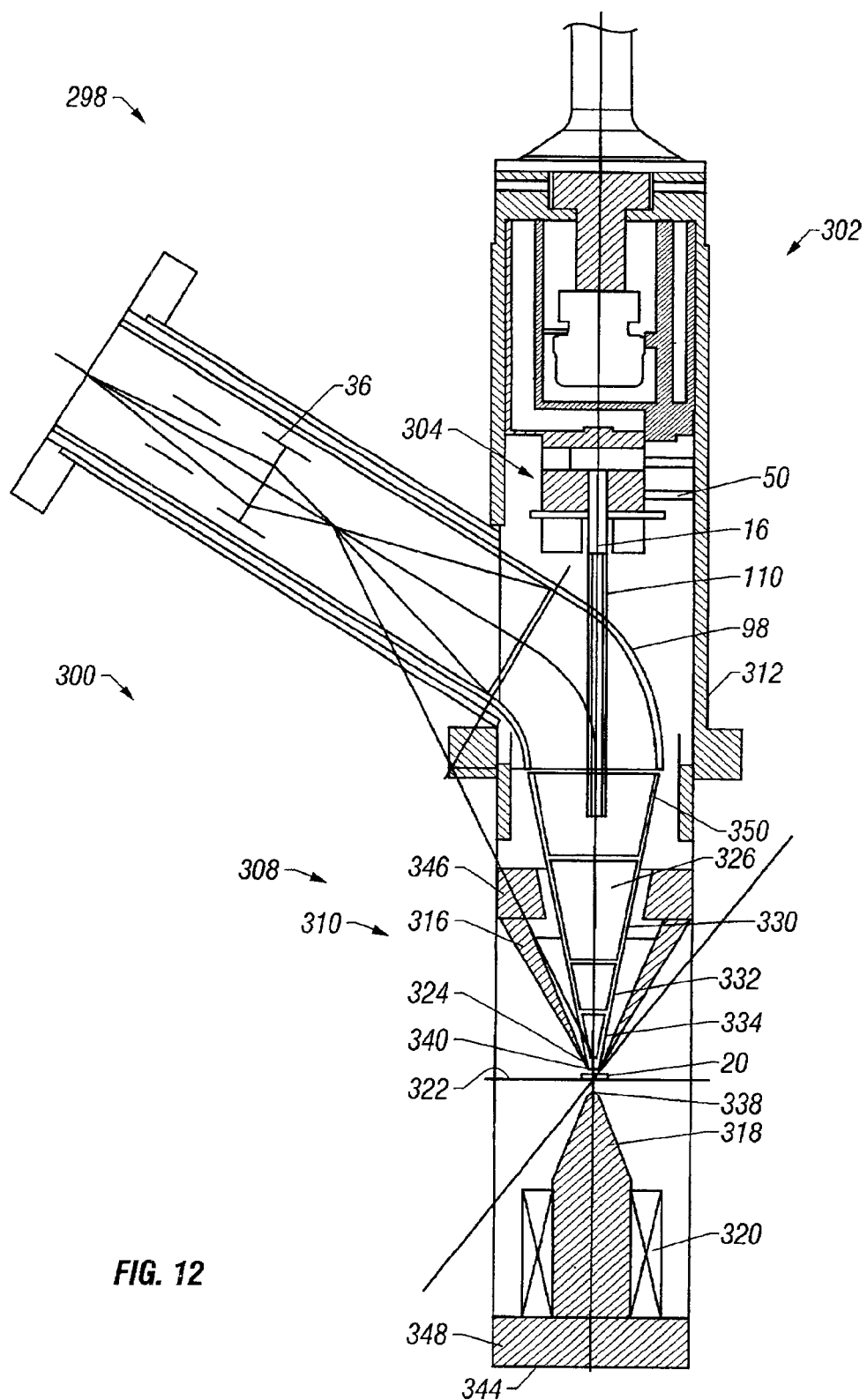
FIG. 12 shows a cross-sectional view of an embodiment of the invention using a dual pole magnetic objective lens.

FIG. 12 depicts a cross-sectional view of another embodiment of the present invention. In the depicted alternate embodiment, similar reference numerals from the preferred embodiment of FIG. 3 have been used to identify any identical components.

A scanning electron microscope (SEM) system 298 includes through-the-lens secondary electron detector system 300 and a primary beam optical system 302. Primary beam optical system 302 comprises a primary beam electron column 304 that includes an objective lens assembly 308.

Objective lens assembly 308 includes a dual pole magnetic lens 310 that is attached to and supported by the wall of a vacuum chamber 312. Dual pole magnetic lens 310 comprises an upper magnetic pole piece 316, a lower magnetic pole piece 318, and a magnetic field generating coil 320. A sample 20 is generally placed on a moveable sample stage 322 between the upper magnetic pole piece 316 and lower magnetic pole 318. Upper magnetic pole piece 316 has an aperture 324 for passing the primary electron beam and the secondary electrons including the Auger electrons.

Objective lens assembly 308 further comprises a primary beam electrostatic deflection system 326 supported by the upper magnetic pole piece 316. Primary beam electrostatic deflection system 326 includes electrostatic deflection plates 330, 332, and 334 mounted on or integrated into the column. Deflector plates 330, 332, and 334 operate on the primary electron beam and the emitted secondary electrons in a manner similar to that describe above with respect to lenses 72, 74, and 76 of FIG. 3. Lower magnetic pole piece 318 can be moved away from upper magnetic pole piece 316 to accommodate a tilted or a thicker sample 20 or can be moved closer to the upper magnetic pole piece 316 for higher SEM and Auger spatial resolution and for higher Auger electron transmission.

Lower magnetic pole piece 318 includes a lower pole head portion 338 disposed below sample 20 and having a pole diameter smaller than that of an upper pole head portion 340 that is disposed above sample 20. Lower magnetic pole piece 318 is generally positioned closer to the sample than is the upper magnetic pole piece 316. This arrangement provides a monotonically decreasing magnetic field in the upward direction that reduces aberrations. An additional pole piece or a segmented upper pole piece can also be employed to minimize the lens aberrations.

The lower magnetic pole piece 318 is excited by the water cooled magnetic field generating coil 320 as is well know in the art. The magnetic circuit to the upper pole may be completed using a yoke 344 made of soft magnetic material and extending from a top portion 346 to a bottom portion 348. Only a part of yoke 344 is shown. Yoke 344 can be formed in a variety of shapes including rectangular or half rectangle to accommodate the sample stage 322. Preferably, the parts of yoke 344 not shown form a magnetic circuit to return the magnetic fields between the lower magnetic lens pole 316 and upper magnetic lens pole 318 piece. Alternatively, the vacuum chamber 312 itself may form the magnetic circuit between lower and upper magnetic lens pole pieces 316 and 318.

Scanning electron microscope system 298 includes transfer spherical capacitor 98 to deflect the Auger electrons from the path of the primary beam. As described previously, a drift tube 110 extends from near the anode 50 through the transfer spherical capacitor 98 to between the spherical deflector 98 and the electrostatic deflection system 326 and allows the primary electron beam to travel undisturbed towards the sample 20. The through-the-lens secondary electron detector system 300 for Auger detection and analysis generally includes previously described components in reference to a preferred embodiment of FIG. 3.

A relatively strong electrostatic potential may also be used in combination with the dual pole magnetic lens 310 to substantially direct the Auger electrons upward and improve the efficiency of the Auger electron detection by the through-the-lens secondary electron detector system 300. For example, 500 to 10,000 V may be selectively applied on the electrostatic deflection plates 330, 332, and 334 to facilitate transmission of the Auger electrons.

In operation, the emitted secondary electrons, including the Auger electrons, are directed upwards by the combined magnetic and electrostatic fields of the objective lens assembly 308. Inside the upper magnetic pole piece 316 the electrostatic deflection plates 330, 332, and 334 are employed for scanning, offsetting and stigmating the primary electron beam 16. These electrostatic deflection plates 330, 332, and 334 and an electrostatic shielding cone 350 disposed above thereon can be biased at a suitable positive potential as described above, to accelerate the secondary electrons for travelling upwards and towards the transfer spherical capacitor 98 or other deflector or separator. This acceleration reduces the angle of the emitted secondary electrons and improves transmission of the Auger electrons. The transfer spherical capacitor 98 sends the secondary electrons towards the transfer lens 36, which inputs the secondary electrons including the Auger electrons to spherical capacitor analyzer 140 as described in a preferred embodiment of FIG. 3 of the present invention.

Preferably, tiltable sample stage 322 is sufficiently thin to provide enough clearance between upper magnetic pole piece 316 and lower magnetic pole pieces 318 to allow tiltable sample stage 322 to be tilted through a desired range of angles. One method to do this is to have a ring supporting the sample 20. The tilt mechanism provided in the ring, and the X, Y, Z and rotate stage mechanisms may be positioned to the side of this ring to conveniently manipulate the ring and sample 20. Alternatively, the stage X, Y and R translation mechanisms may be positioned around the ring and the Z and tilt mechanisms disposed on both ends. It is to be understood that other combinations or configurations may be suitably employed for designing the tiltable sample stage 322. The invention is not limited to the configuration shown in FIG. 13. For example, the sample 20 may be perpendicular to the sample stage 322 or tilted. In one embodiment, the sample stage 322 allows the lower magnetic pole piece to be about 1 mm from the lower surface of the sample over the full X-Y dimensions of the sample 20.

Figure 13:
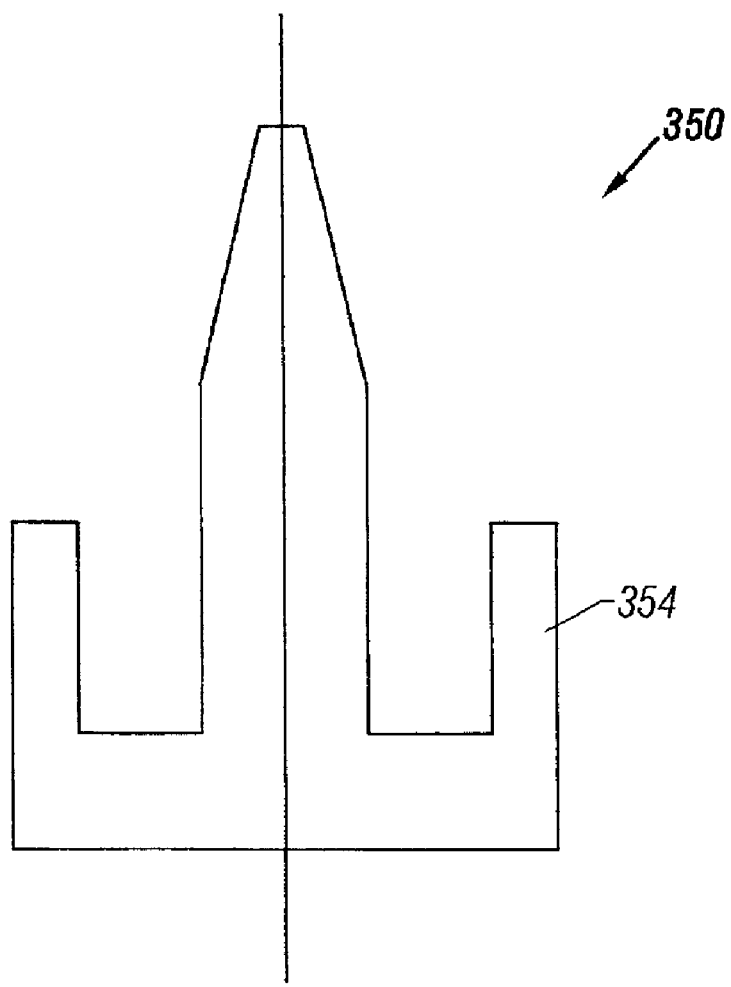
FIG. 13 depicts an alternate lower pole piece for an SEM using a dual pole magnetic lens.

FIG. 13 shows an alternate dual pole lens 350 that does not require a magnetic yoke. For completing the magnetic circuit, a cup-shaped lower magnetic pole piece 354 directs the returning magnetic flux or fields towards the upper magnetic pole piece 316.

The invention described above is particularly useful when high resolution is required for samples, such as semiconductors, having sensitive surfaces. Modern semiconductor fabrication labs require maximum performance for both SEM imaging and Auger analysis. The present invention provides spatial resolution between 10 and 100 Angstroms while maintaining a collection efficiency of up to 10% or greater, compared to prior art systems that provide resolution of between 100 and 200 Angstroms and a collection efficiency of around 15%. Using the invention, an analyst can efficiently determine elemental distributions of thin surface layers and image topographical features. The invention can coaxially image and analyze a sample to a resolution of 10–20 Angstroms at a greatly reduced signal acquisition time. The secondary electron collection efficiency of ten percent or greater reduces sample damage by reducing the total number of bombarding electrons required to produce sufficient Auger electrons to analyze.

The invention is not limited to Auger electron analyses but is useful with any technique that uses secondary electrons. The nature of the primary beam and the Auger detector system used in practicing the invention also depends upon the nature of the specimen under investigation, the desired electron beam energy and the type of analysis. Other types of Auger detector systems, electrostatic deflectors, magnetic lenses, deflection systems and analyzers can also be used.

The embodiments described above are merely illustrative and skilled persons can make variations on them without departing from the scope of the invention, which is defined by the following claims.

Multiple embodiments of different parts of the system are described. These different parts can be combined in various ways for different applications and the combinations are limited to the specific combinations described above. For example, the two spherical capacitor secondary electron collection system of FIG. 11 could be combined with the objective lens of FIG. 12, or parallel plates can be used in place of the drift tube in any of the embodiments.

The invention has many aspects. Not every embodiment will include every aspect of the invention. One aspect of the invention provides a system for through-the-lens collection of Auger electrons in a high resolution scanning electron microscope system in which the resolution of the high resolution scanning electron microscope is not substantially degraded by the secondary electron collection system.

A further aspect of the invention increases the Auger signal acquisition speed in a scanning electron microscope.

Yet another aspect of the invention provides an SEM that can produce an Auger view substantially aligned with the SEM view.

Yet a further aspect of the invention provides for efficient collection of Auger electrons through a high resolution snorkel objective lens.

Still another aspect of the invention provides for efficient collection of Auger electrons through one of the poles of a dual pole magnetic objective lens.

Still a further aspect of the invention increases the collection and transmission efficiency of Auger electrons in a scanning electron microscope.

Yet a further aspect of the invention collects secondary electrons through the primary beam objective lens while diverting the secondary electrons out of the path of the primary beam without significantly reducing the resolution of the primary beam.

Although the present invention and its advantages have been described in detail, it should be understood that various changes, substitutions and alterations can be made to the embodiments herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A scanning electron microscope system including an electron energy analyzer, comprising:
    a primary electron beam column for forming a primary electron beam and focusing it onto the specimen, the primary electron beam column including a high resolution objective lens that immerses the sample in a magnetic field; and
    a secondary electron optical system for collecting secondary electrons through the high resolution objective lens, the secondary electron system including:
        a lens creating an accelerating field for accelerating secondary electrons through the high resolution objective lens;
        an electrostatic capacitor for deflecting the secondary electrons from the path of the primary beam;
        a shield extending substantially through the electrostatic capacitor and shielding the primary beam from deflection and aberrations caused by the electrostatic capacitor, the shield being conductive on the inside to shield the primary beam and having on the outside a potential gradient to create an external electric field related to the electric field of the electrostatic capacitor, thereby reducing distortion of the field of the electrostatic capacitor caused by the shield; and
        an electron energy analyzer for determining the energy of the secondary electrons.

2. The scanning electron microscope of claim 1 in which the electrostatic capacitor comprises a spherical capacitor.

3. The scanning electron microscope of claim 1 in which the shield comprises a tube or polygon.

4. The scanning electron microscope of claim 1 in which the shield comprises a pair of or multiple plates.

5. The scanning electron microscope of claim 1 in which the high resolution lens comprises a snorkel lens.

6. The scanning electron microscope of claim 1 in which the high resolution lens comprises a double pole magnetic lens.

7. The scanning electron microscope of claim 1 further comprising a transfer lens for adapting the output of the spherical capacitor to the input of the electron energy analyzer.

8. A scanning electron microscope system including an electron energy analyzer, comprising:
    a primary electron beam column for forming a primary electron beam and scanning the beam across a specimen surface to cause the emission from the specimen of secondary electrons including Auger electrons, the primary electron beam column including a high resolution objective lens;
    a secondary electron optical system for collecting the Auger electrons through the objective lens, the secondary electron system including a deflector for deflecting the secondary electrons from the path of the primary beam without significantly degrading the resolution of the primary beam; and
    an electron energy analyzer for analyzing the Auger electrons.

9. The scanning electron microscope system of claim 8 in which the deflector produces a field for deflecting the Auger electrons and further comprising a shield that shields the primary beam from the field.

10. The scanning electron microscope system of claim 8 in which the high resolution lens includes a snorkel lens.

11. The scanning electron microscope system of claim 8 in which the high resolution lens includes a dual pole magnetic lens.

12. The scanning electron microscope system of claim 11 in which the dual pole magnetic lens comprises:
- an upper magnetic pole piece having an aperture for passing the primary electron brain and the Auger electrons; and
- a lower magnetic pole piece having a magnetic field generating coil, wherein the dual pole magnetic lens disposed in the first lens assembly focuses the primary electron beam and focuses upward the Auger electrons including the substantial portion of the emitted Auger electrons from the specimen.

13. The scanning electron microscope system of claim 12 in which the upper magnetic pole piece includes a plurality of electrostatic deflection plates to selectively apply an electrostatic potential to substantially direct the Auger electrons towards the deflector as well as to scan the primary electron beam.

14. The scanning electron microscope system of claim 12 in which the lower magnetic pole piece is movably attached to mechanically move the lower magnetic pole piece upwards for relatively higher scanning electron microscope spatial resolution, higher Auger spatial resolution, and higher Auger electron transmission.

15. The scanning electron microscope system of claim 12 in which the sample can be raised or lowered for relatively higher scanning electron microscope spatial resolution, higher Auger spatial resolution, and higher Auger electron transmission.

16. The scanning electron microscope system of claim 8 in which the primary electron beam column for forming a primary electron beam and scanning the beam across a specimen surface includes a primary beam column providing a beam energy of between about 3 keV and about 30 keV.

17. The scanning electron microscope system of claim 8 in which the secondary electron optical system includes optical element that focus the secondary electrons near the entrance of the energy analyzer.

18. A scanning electron microscope system including an electron energy analyzer, comprising:
- a primary electron beam column for forming a primary electron beam and scanning the beam across a specimen surface to cause the emission from the specimen of secondary electrons, the primary electron beam column including a high resolution objective lens; and
- a secondary electron optical system for collecting the secondary electrons through the objective lens, the secondary electron system including a deflector for deflecting the secondary electrons from the path of the primary beam without significantly degrading the resolution of the primary beam the deflector produces a field for deflecting the secondary electrons, the deflector including a shield that shields the primary beam from the field and that is conductive on the inside and resistive on the outside to maintain a potential gradient on the outside corresponding to the field of the deflector.

19. The scanning electron microscope system of claim 18 in which the deflector comprises a spherical capacitor and in which the primary beam shield comprises a tube extending substantially through the spherical capacitor, the tube having a potential gradient on the outside corresponding to the field gradient in the spherical capacitor.

20. A scanning electron microscope system including an electron energy analyzer, comprising:
- a primary electron beam column for forming a primary electron beam and scanning the beam across a specimen surface to cause the emission from the specimen of secondary electrons including Auger electrons, the primary electron beam column including a high resolution objective lens;
- a secondary electron optical system for collecting the Auger electrons through the objective lens, the secondary electron system including an electrostatic detector that does not use a magnetic field and that deflects the Auger electrons from the path of the primary beam without significantly degrading the resolution of the primary beam, and
- an energy analyzer for analyzing the Auger electrons.

21. The scanning electron microscope system of claim 20 in which the deflector comprises a spherical capacitor.

22. A scanning electron microscope system including an electron energy analyzer, comprising:
- a primary electron beam column for forming a primary electron beam and scanning the beam across a specimen surface to cause the emission from the specimen of secondary electrons, the primary electron beam column including a high resolution objective lens, the primary electron beam having a resolution finer than 5 nm and electron energies of between 3 keV and 30 keV; and
- a secondary electron optical system for collecting the secondary electrons through the objective lens, the secondary electron system including a deflector for deflecting the secondary electrons from the path of the primary beam without significantly degrading the resolution of the primary beam and an electron energy analyzer for determining the energy of some of secondary electrons.

23. The scanning electron microscope system of claim 22 in which the primary electron beam has a resolution finer than 2 nm.

24. The scanning electron microscope system of claim 22 in which the energy analyzer comprises a spherical capacitor analyzer.

25. A scanning electron microscope system including an electron energy analyzer, comprising:
- a primary electron beam column for forming a primary electron beam and scanning the beam across a specimen surface to cause the emission from the specimen of secondary electrons including Auger electrons, the primary electron beam column including a high resolution objective lens; and
- a secondary electron optical system for collecting the secondary electrons through the objective lens, the secondary electron system including a deflector for deflecting the secondary electrons from the path of the primary beam without significantly degrading the resolution of the primary beam, the collection efficiency being greater than twenty percent for Auger electrons having an energy of 100 eV.

26. A method of determining the composition of a material on a specimen surface, the method comprising
- creating a beam of primary electrons;
- directing the beam of primary electrons toward the specimen surface including passing the electron beam through a shield, the shield including an inner surface and an outer surface, the inner being conductive to shield the beam of primary electrons and the outer surface being resistive and charged to create an external electric field related to the electric field of an electrostatic deflector, thereby reducing distortion of the field of the deflector from the shielding tube and passing the electron beam through at least a portion of an objective lens that immerses the specimen in a magnetic field;

directing through the objective lens secondary electrons emitted by Auger processes from atoms of the specimen;

deflecting the secondary electrons away from the path of the primary beam toward a secondary electron energy analyzer positioned off the path of the primary beam; and analyzing the energy of the secondary electrons.

27. A method of performing Auger electron spectroscopy using a high resolution scanning electron microscope, comprising;

directing a beam of primary electrons through an objective lens toward a specimen surface;

collecting Auger electrons through the objective lens, the Auger electrons forming a virtual Auger source at a disk of least confusion;

forming an image of the virtual Auger source off the path of the primary beam; and analyzing the energy of the Auger electrons.

28. The method of claim 27 which directing a beam of primary electrons through an objective lens toward a specimen surface includes directing the primary electrons through a shield to reduce aberration of the beam by fields used to form the image of the Auger electron source.

29. The method of claim 27 in which forming an image of the virtual Auger source includes focusing the Auger electrons near the electron entrance of an energy analyzer.

30. A method of performing Auger electron spectroscopy using a high resolution scanning electron microscope, comprising:

directing a beam of primary electrons through a high resolution objective lens toward a specimen surface;

collecting Auger electrons through the objective lens, the Auger electrons forming a virtual Auger source at a disk of least confusion;

forming an image of the virtual Auger source off the path of the primary beam using an electrostatic capacitor; and analyzing the energy of the Auger electrons.

31. A scanning electron microscope system including an electron energy analyzer, comprising:

a primary electron beam column for forming a primary electron beam, the primary column including:
an electron source
a beam scanning deflector for scanning the beam across a specimen surface to cause the emission from the specimen of secondary electrons, and
a high resolution objective lens; and a secondary electron optical system for collecting and analyzing the energy of the secondary electrons through the objective lens, the secondary electron system including a secondary particle deflector for deflecting the secondary electrons from the path of the primary beam without significantly degrading the resolution of the primary beam, the secondary particle deflector being positioned closer to the electron source than the beam scanning deflector and including a spherical capacitor energy analyzer.

* * * * *